(12) United States Patent
Breton et al.

(10) Patent No.: US 12,395,766 B2
(45) Date of Patent: *Aug. 19, 2025

(54) METHOD FOR COLLECTING DATA IN A NETWORK, SENSOR, CONSUMPTION METER, TEMPORARY RECEIVER AND NETWORK

(71) Applicants: Diehl Metering Systems GmbH, Nuremberg (DE); Diehl Metering S.A.S., Saint Louis (FR)

(72) Inventors: Aster Breton, Saint Veran (FR); Guy Bach, Waldighofen (FR); Christoph Sosna, Nuremberg (DE); Klaus Gottschalk, Winkelhaid (DE); Achim Schmidt, Weissenohe (DE); Thomas Kauppert, Nuremberg (DE); Petra Joppich-Dohlus, Rathsberg (DE); Stefan Schmitz, Nuremberg (DE)

(73) Assignees: Diel Metering Systems GmbH, Nuremberg (DE); Diehl Metering S.A.S., Saint Louis (FR)

( * ) Notice: Subject to any disclaimer, the term of this patent is extended or adjusted under 35 U.S.C. 154(b) by 339 days.

This patent is subject to a terminal disclaimer.

(21) Appl. No.: 17/346,447

(22) Filed: Jun. 14, 2021

(65) Prior Publication Data
US 2021/0306723 A1    Sep. 30, 2021

Related U.S. Application Data

(63) Continuation of application No. PCT/EP2018/084981, filed on Dec. 14, 2018.

(51) Int. Cl.
*H04Q 9/04*    (2006.01)
*G01F 15/063*    (2022.01)
*G01R 21/133*    (2006.01)

(52) U.S. Cl.
CPC ............. *H04Q 9/04* (2013.01); *G01F 15/063* (2013.01); *G01R 21/1333* (2013.01); *H04Q 2209/20* (2013.01); *H04Q 2209/60* (2013.01)

(58) Field of Classification Search
CPC .. H04Q 9/04; H04Q 2209/20; H04Q 2209/50; H04Q 2209/60; G01F 15/063; G01R 21/1333

(Continued)

(56) References Cited

U.S. PATENT DOCUMENTS 11,118,938 B2 *  9/2021  Schmidt ................. G01D 4/006
11,162,813 B2 * 11/2021  Sosna ...................... H04Q 9/00

(Continued)

FOREIGN PATENT DOCUMENTS

EP    3249490 A1 * 11/2017 ......... F24D 19/1066
FR    3068163 B1 * 12/2019 ............. G01D 4/004

(Continued)

OTHER PUBLICATIONS

English translation of EP 3249490, Nov. 2017. (Year: 2017).*

*Primary Examiner* — Michael P Nghiem
(74) *Attorney, Agent, or Firm* — Laurence A. Greenberg; Werner H. Stemer; Ralph E. Locher

(57) ABSTRACT

A method collects data in a network having a consumption meter as part of a supply network and containing a sensor. The sensor contains a measuring element which provides raw measurement data corresponding to a physical or physicochemical value or parameter. The sensor contains a communication device and a memory. For the determination of the measurement resolution of the sensor the conditions for generating time stampings using a correlation model are determined in advance. On a basis of the correlation model, time stampings of successive raw measurement data in the sensor are generated, the time stampings are stored in the (Continued)

memory. The time stampings are transmitted over a wired connection and/or a radio link so that on the basis of the time stampings using the correlation model the raw measurement data collected by the measuring element are reconstructed and evaluated. Whereas raw measurement data is used for on-demand network analysis.

46 Claims, 18 Drawing Sheets

(58) Field of Classification Search
USPC .......................................................... 702/187
See application file for complete search history.

(56) References Cited

U.S. PATENT DOCUMENTS

| | | | | |
|---|---|---|---|---|
| 11,245,969 | B2* | 2/2022 | Schmitz | G01D 21/00 |
| 11,399,222 | B2* | 7/2022 | Schmitz | G01D 4/002 |
| 11,425,473 | B2* | 8/2022 | Joppich-Dohlus | H04Q 9/02 |
| 11,882,506 | B2* | 1/2024 | Breton | H04L 1/1678 |
| 2007/0124109 | A1 | 5/2007 | Timko et al. | |
| 2012/0050065 | A1* | 3/2012 | Lombardi | H04Q 9/00 340/870.02 |
| 2013/0076528 | A1* | 3/2013 | Boettner | G16H 50/30 340/870.02 |
| 2014/0325100 | A1* | 10/2014 | Jung | G06F 13/10 710/72 |
| 2015/0281809 | A1* | 10/2015 | Foster, III | H04Q 9/04 340/870.26 |
| 2016/0109495 | A1* | 4/2016 | Sterkel | H04L 67/303 702/62 |
| 2016/0378814 | A1* | 12/2016 | Bowman | G06F 16/2322 707/604 |
| 2017/0026144 | A1* | 1/2017 | Zinner | H04L 63/123 |
| 2020/0128309 | A1* | 4/2020 | Bach | H04Q 9/16 |
| 2021/0306821 | A1* | 9/2021 | Breton | H04W 4/35 |

FOREIGN PATENT DOCUMENTS

| | | |
|---|---|---|
| WO | 2015148274 A1 | 10/2015 |
| WO | 2017004182 A1 | 1/2017 |

* cited by examiner

METHOD FOR COLLECTING DATA IN A NETWORK, SENSOR, CONSUMPTION METER, TEMPORARY RECEIVER AND NETWORK

CROSS-REFERENCE TO RELATED APPLICATION

This application is a continuation, under 35 U.S.C. § 120, of copending international application No. PCT/EP2018/084981, filed Dec. 14, 2018, which designated the United States; the prior application is herewith incorporated by reference in its entirety.

BACKGROUND OF THE INVENTION

Field of the Invention

This invention describes a method for collecting data according to the independent method claim, a sensor according to the independent sensor claim, a consumption meter according to the independent consumption meter claim, a temporary receiver according to the independent receiver claim and a network according to the independent network claim.

Consumption meters are part of supply networks for the distribution of consumable goods, such as gas, water, heat or electricity, and are used to generate consumption data. On the basis of raw measurement data provided by a measuring element of a sensor, consumption data is calculated by a microprocessor on the meter side and forwarded to a central data management system (head-end system) via a communication system in the form of a BUS system, in particular a so-called M-BUS system. The data are mainly the current consumption measured by the consumption meters, i.e. the meter status.

Raw measurement data is generated by the measuring element of a sensor of the consumption meter at predetermined times, evaluated by a microprocessor of the consumption meter, i.e. converted into consumption data, and the resulting metering data is then requested by a reading or receiving device (M-BUS master or concentrator or data collector) via a primary communication path at predefined times at the individual locally arranged consumption meter. These metering data are then transmitted from the reading or receiving device via a tertiary communication link, for example based on LAN, GPRS, 3G, LTE, to a head-end system. The consumption data can then be displayed in the head-end or used for invoicing. The existing concept of consumption data acquisition is limited both in its depth of information and in its scope of information.

BRIEF SUMMARY OF THE INVENTION

The aim of the present invention is to provide a generic procedure in a network for collecting and/or forwarding data and the sensors, consumption meters, temporary receivers as well as the network to be used for this purpose, each with increased information content.

The aim is achieved by the characteristics of a method for collecting data according to the independent method claim, a sensor according to the independent sensor claim, a consumption meter according to the independent consumption meter claim, a temporary receiver according to the independent receiver claim and a network according to the independent network claim.

This invention describes a method for collecting data in a network, preferably data in connection with a consumption, a physical or physicochemical parameter and/or an operating state in the context of an operation of a local sensor, preferably a sensor for a consumption meter as part of a supply network containing at least one local sensor, preferably a plurality of local sensors for the distribution of a consumable good, with a plurality of sensors. The sensor contains at least one measuring element, the measuring element of the respective sensor provides elementary measuring units in the form of raw measurement data which corresponds to at least one physical or physicochemical value or at least one physical or physicochemical parameter, and the sensor contains wired and/or radio communication means and memory means. For the determination of the measurement resolution of the sensor the conditions for generating time stampings using a correlation model are determined in advance, on the basis of the correlation model time stampings of successive raw measurement data in the sensor are generated. The time stampings are stored in the memory means of the consumption meter. The time stampings are transmitted over a wired connection and/or a radio link so that on the basis of the time stampings using the correlation model the raw measurement data collected by the measuring element are reconstructed and evaluated, whereas raw measurement data is used for on-demand network analysis.

Preferably the time stampings are transmitted over a wired connection and/or a radio link via a primary communication path to a temporary receiver. The temporary receiver is intended for readout without a directly downstream network for processing the data, in particular the time stampings. A temporary receiver is therefore not necessarily part of a larger network. Therefore, the temporary receiver only needs a connection to the sensors or consumption meters to be monitored for operation. It is advisable for the time stampings to be stored in the temporary receiver.

It is advantageous to use temporary receivers for gathering time stampings of sensors and/or consumption meters in a defined coverage area. Sensors and/or consumption meters can usefully store and provide time stampings that can be used for reconstructing raw measurement data, so that historical raw measurement data can be called up accordingly if required. Temporary receivers can be placed in a defined coverage area where problems in the supply network, for example, are suspected. For example, there may be a suspicion of leakage, so that with the installation of a temporary receiver the condition of the network can be checked quickly and easily. Temporary receivers can also be used to test new installations before they are put into operation by the end user. An example is the monitoring and testing of the supply network in a new housing development area.

Preferably the use of a temporary receiver for gathering time stampings is limited to a certain period of time. The period of use of a temporary receiver depends on its tasks. The discovery and analysis of a problem in a network, especially in a consumption network, is one of the tasks of the temporary receiver. Thus, the use of the temporary receiver can be limited to the time until the problem is solved. The duration can usually range from one day to several months, for example three months.

In one embodiment of the invention, there is the possibility that the temporary receiver is forwarding the received time stampings via a tertiary communication path to a remote central processing facility. The forwarding can take place in certain predefined time intervals. The time stampings can, for example, be received, stored and evaluated in the remote central processing facility.

Alternatively or additionally there is the possibility that the temporary receiver is read out in a remote central processing facility. For this purpose, the temporary receiver can be read out on site in the remote central processing facility via a cable connection or via a radio connection.

It is advantageous that the network monitoring and evaluation of the data takes place in a remote central processing facility. Once the time stampings have been transmitted to the remote central processing facility, the analysis of the data, in particular the analysis of the time stampings can be carried out.

This allows the temporary receiver to quickly and easily monitor and check the installation of sensors and/or consumption meters and detect possible errors.

In accordance with the invention, for determining the measurement resolution of the sensor the conditions for generating of time stampings using a correlation model are determined beforehand. On the basis of the correlation model time stampings of successive raw measurement data are generated in the sensor and stored in the memory means. Subsequently only the time stampings corresponding to the recorded raw measurement data are transmitted, so that on the basis of the time stampings using the correlation model the recorded raw measurement data can be reconstructed and evaluated after successful transmission. This eliminates the need for computing-intensive and therefore energy-intensive computing operations in the area of the local sensor and/or consumption meter. Computing-intensive and energy-intensive computing operations can be relocated into the area of a data collector or a head-end. The invention-based method makes it possible to provide time stampings of raw measurement data in a continuous, complete and consistent time context, especially without gaps in the area of a remote central processing facility or a head end system. The raw measurement data reconstructed by the time stampings can be continuously assigned to the time axis, i.e. they represent a real time course that excludes discontinuous gaps or data lapses. The continuous, time-stamped raw measurement data stream generated according to the inventive method has a much higher resolution over the continuous time axis compared to existing solutions. The invention therefore enables, in addition for example a consumption calculation, a much larger number of calculations and/or determinations and/or additional features such as functions including "business" functions, for example in the head-end system, than was previously possible. The inventive procedure also makes it possible to determine the condition of a supply network. This enables the provider to offer the customer of a supply network much greater transparency than before. Due to the ingenious method, the design of the sensor can also be much simpler and more cost-effective, since complex microprocessors for calculations, e.g. for calculating the flow rate, are no longer required. Due to the recorded temporal correlation of the raw measurement data, manipulations can be avoided, since the measurement results can be compared with empirical values over the entire time axis. Furthermore, due to the elimination of energy-intensive computing power, the energy consumption of the module consisting of a sensor and time stamping processing or communication equipment is considerably lower than with previous versions, which evaluate the data locally at the consumption meter. The time stampings may be points in time or time differences. The points in time or time differences may be actual time data or real time data or at least be oriented towards it. The time differences may be formed from time stamping to time stamping or from a predefined point in time.

The network may be, for example, an electrical, gas or water network with modules or consumption meters generating and/or using raw measurement data, which are located at each endpoint of the network. Furthermore, the network may be configured as a smart grid.

An on-demand network analysis can be easily performed by recording raw measurement data. As soon as there is a need for certain data, which can go beyond consumption data, these data can be calculated from the raw measurement data. Since reconstructed raw measurement data from the time stampings is available from each sensor and/or consumption meter or a raw measurement data stream is reconstructed or can be reconstructed from each sensor and/or consumption meter, analyses of the entire network can be conducted.

It is advisable to have data collectors in the network which, for example, receive, temporarily store and/or store for retrieval data, in particular time stampings and/or raw measurement data reconstructed from time stampings of surrounding sensors and/or consumption meters which are within radio range. Data collectors can also act as transceivers in the network by forwarding received data streams, especially time stampings used for reconstructing raw measurement data streams in the network. It is therefore advisable for sensors and/or consumption meters and/or data collectors to form nodes of the network. The data collectors can also be configured as stationary data collectors and/or as mobile data collectors. The transmission of the time stampings enables a significant higher number of calculations and/or findings and/or functions including "business"-functions to be carried out in the head-end, where sufficient computing power is available.

Within the framework of the correlation model a certain value, a certain change in value or a certain difference in value of the at least one physical or physicochemical value or at least one physical or physicochemical parameter may be determined for the assignment of a time stamping, whereas on recording the certain value, the certain change in value or the certain difference in value by the measuring element a time stamping is triggered and stored in the memory means of the sensor, where it is provided for transmission. If the value detected by the sensor does not change no time stamping is generated. Thus, typically for the method according to the invention, longer periods can elapse without time stampings. This means that data does not have to be transferred all the time. Nevertheless, the method has a very good resolution.

Especially within the framework of the correlation model a stepwise or incremental increasing meter reading and/or a table of values may be represented by time stampings.

Preferably the time stampings have a sign, for example a plus or minus sign. This is particularly advantageous when mapping a value table, as it determines whether the concrete time stamping affects an ascending or descending value in the value table.

It is particularly useful that for reconstructing and evaluating the raw measurement data collected by the measuring element a basic index of the sensor and time stampings indicating an incremental increase and/or decrease of the index are transmitted. In order to obtain the consumption data, the base index is used and the index is adjusted according to the time stampings transferred. The base index can therefore be used as a reference value for the following time stampings.

According to the invention, a number of time stampings may be transmitted over the primary communication path as a data packet or as a data telegram.

The elementary measuring units may refer to the electric voltage or to the electric current. For example, the output voltage of a Hall sensor can be measured in case of its excitation or the voltage of a temperature sensor.

It is particularly useful that nodes of the network are used as temporary transceivers for on-demand network analysis. A structure or arrangement in the network can, for example, be defined by a hierarchical system of consumption meter, data collector and head-end. If required, transceivers can be used temporarily in the network without having to observe a fixed structure in the network. This has the advantage that increased flexibility and increased redundancy can be guaranteed in the network.

It is possible that temporary transceivers are used for mobile reading scenarios. With mobile transceivers it is possible that these are placed in a certain area and that data from consumption meters in the environment is temporarily forwarded by them. For example, if required, the data throughput rate can be increased compared to the sole use of adjacent consumption meters as transceivers.

If a permanent radio link to a sensor and/or a consumption meter is not available, it is advantageous to use nodes of the network as temporary transceivers. This ensures 100 percent or almost 100 percent availability of the individual sensors or consumption meters in the network.

It is possible that the network is formed as a mesh-network. In a mesh network the infrastructure nodes connect directly, dynamically and non-hierarchically to as many other nodes as possible. Moreover the nodes cooperate with one another to efficiently route data throughout the network from a starting point to an end point. The transceivers in the network may therefore act as nodes in the mesh network. Since these are temporary transceivers, they can function as nodes in the mesh network as required. A mesh network for communication has the advantage that all end points in the network are accessible and covered. Thus, for example, the density of stationary data collectors can be reduced. In addition, the routes of mobile data collectors can be aligned accordingly and thus designed more efficiently. For example, a mobile data collector no longer has to be within the radio range of each sensor and/or consumption meter. It is sufficient to establish radio connections with neighboring sensors and/or consumption meters.

It is advantageous that the information transfer within the network is realized by a cascade of temporary transceivers. To ensure the communication in the network, the information transfer can be realized by a cascade of temporary transceivers. Thus, several different paths can be made available in the network to ensure the transfer of information and data, especially time stampings. Advantageously, communication or the reconstructed raw measurement data stream can be maintained even in the event of interference from individual transceivers in the network. The individual transceivers can be connected, for example via Ethernet, LAN, GPRS, 3G and/or LTE.

The advantage is that network analysis and/or monitoring can take place during live operation, preferably in real time. The raw measurement data reconstructed by the time stampings can thus be used for network monitoring in an intelligent network (smart grid). Real-time network monitoring makes it possible, for example, to adapt the network to current consumption. Moreover, network monitoring may comprise load-dependent network restructuring. The load on the network, e.g. between points A and B, can thus be easily determined so that the flow rate in the network can be adjusted accordingly. Furthermore, parts or sections of the network can be identified which are less or least efficient, so that countermeasures can be taken early on, even before there is an undersupply or similar in these areas. For example, in a water supply network, consumption may increase and/or decrease randomly in parts of the network. This has the advantage that fluctuations in the supply and/or impending supply gaps can be detected quickly and easily and corresponding countermeasures can be initiated. In addition to the restructuring of the network for the consumable product, load-dependent network restructuring can also include a restructuring of the radio network. If individual nodes in the network are busy, the data transfer, in particular the time stampings used for the reconstructing of the raw measurement data stream from sensors and/or consumption meters can be diverted via other nodes or transceivers in the network.

It is particularly useful that a consumption signature is determined for the individual sensor and/or the individual consumption meter of the plurality of sensors and/or consumption meters. For each sensor and/or consumption meter in the network a consumption signature can be determined, so that the individual sensor and/or the individual consumption meter can be clearly identified and addressed network-wide. The advantage is that the individual signature is used to identify a potential metering failure. This makes it quick and easy to identify a potentially error-prone or failing sensor and/or consumption meter. As soon as, for example, the signature deviates from the known signature of a sensor and/or consumption meter, a change can easily be detected, which indicates a possible problem in the network, such as the occurrence of a leak.

The network preferably forms a closed consumption network with inputs and outputs, whereas unidentified outputs from the network are being used for fault diagnosis. In a closed consumption network it is possible to measure the inputs and the outputs. The unidentified outputs may be faulty sensors and/or consumption meters, for example, which measure incorrect values or send incorrect data. If the network is a water network, leaks, for example, can lead to an unidentified outflow from the network.

It is possible that the network is structured hierarchically. Here it is advisable for the local sensor(s) and/or consumption meter(s) to be connected to the data collector via a primary communication path, for a tertiary communication path to be provided between the data collector and a head end, and for the time stampings transmitted by sensors and/or consumption meters to be collected, stored and/or evaluated in the data collector and/or the head end. The hierarchical structure of the network and the design as a mesh network can represent alternative designs. However, both structures can also be implemented within the same network. For example, the network can be operated in a hierarchical structure and, if required, individual nodes or transceivers in the network can be operated as a mesh network. This makes it easy to avoid network interruptions, for example, since redundant communication paths, e.g. in the form of temporary transceivers, are provided in the network.

It is possible that a configuration of a sensor and/or a consumption meter and/or a line section is determined based on the current consumption in the network. For this purpose, fluctuations or deviations can be registered and observed in the network, for example, in order to determine badly configured sensor and/or consumption meters and/or line sections. This can be done based on the principle of random consumption. For example, due to pipes, pipe fittings and seals, the total amount of water in a water network can more or less increase or decrease, which means that the entire system no longer has a constant or fixed volume. This invention makes it possible, particularly by using the raw measurement data reconstructed from time stampings, to track the actual consumption, especially the water consumption, due to the high temporal accuracy.

A sensor and/or consumption meter consumption profile analysis can be performed for diagnosis of the network. The raw measurement data stream of the sensor and/or consumption meter can be used to create a consumption profile of the sensor and/or consumption meter. The sensor and/or consumption meter consumption profile is analyzed to get a diagnosis of the network. For example, leakages could be identified or the type of consumer downstream of the sensor and/or the consumption meter can be determined. The network may also perform a self-diagnosis. The average of the network sensor and/or consumption meter consumption profiles can be used to determine and evaluate overall network efficiency.

It is advantageous to take a snapshot of the network at time $T_0$ to determine the current meter reading of the sensors. The snapshot of the network can include, for example, the inflows and outflows to and from the network. Sensors and/or consumption meters may be attached to the outflows in a water network, for example. Leakages and/or fluctuations, such as pressure fluctuations, can also occur in the network. In addition, storage tanks, such as a water storage tank, can be provided in the network.

It is useful to take a snapshot of the network at time $T_1$ to determine the consumption in the time interval from time $T_0$ to time $T_1$. For example, consumption in a water network can be expressed in volume. Thus, the consumption in the network can be determined in a simple way by snapshots at different times $T_0$ and $T_1$. The continuity equation for the network is given as $\partial \phi/\partial t + \nabla \cdot (\phi V) = S$. Consumption can therefore be determined on the basis of the instantaneous consumption of the individual components or consumers in the network at a certain time. By taking snapshots on a regular basis, leaks or other problems in the network can be quickly detected and identified. For this purpose, a program can be automatically executed on a server at regular intervals. This means that even unforeseeable events can be detected quickly and easily.

To calculate the time derivative of the current consumption, it is advantageous to use a consumption value reconstructed from time stampings that is infinitesimal in time before the current consumption value. The continuous raw measurement data stream through the sensor and/or consumption meter allows several snapshots of the network to be taken at infinitesimal time intervals. This makes it possible to calculate a time derivative of the current consumption.

It is possible that the time derivative of the current consumption value is formed to extrapolate the consumption of a sensor and/or consumption meter. The time derivation of the current consumption is required for the time extrapolation of the current consumption. The time extrapolation of the current consumption can be determined for an endpoint of the network, such as sensor and/or a consumption meter. If the time intervals between snapshots of the network are not sufficiently small, as is the case with the current state of the art, errors may occur in determining the time derivative and thus in extrapolation.

Network monitoring and evaluation of the data can conveniently take place in a remote central processing facility. Network communication as well as data processing and evaluation can therefore take place on a server, for example. The remote central processing facility can comprise a head-end.

In addition to its temporal resolution (sampling rate or multiple of the sampling rate), the raw measurement data stream can preferably be evaluated at any time on a time-historical basis without gaps. This results in the advantage that, for example, status changes in the supply network (e.g. overflow, underflow, leaks, manipulation attempts, etc.) that occurred in the past can also be determined or documented in precise time allocation and without gaps. Furthermore, it is possible to display past consumption data much more precisely to the consumer and/or to better include them in evaluations with regard to consumption behavior or changes to the same. This in turn has a consumption-optimizing effect and represents particularly important information for the consumer from the network or grid supplier.

The successive raw measurement data concerned are in particular not calculations and/or evaluations but elementary measurement units.

Ideally, the or one of the measured physical quantity(s) may relate to a flow medium, each time-stamped elementary measuring unit corresponding to an elementary fluid quantity measured by the measuring element of the respective sensor on the basis of its measuring accuracy.

It is appropriate that the measured physical or chemical-physical parameter(s) triggering time stampings may characterize the quality and/or composition of a fluid flowing through or contacted by the sensor concerned, such as turbidity, the presence of pollutants or the presence of a solid and/or gaseous fraction or solid and/or gaseous fractions.

Depending on the medium for which the consumption meter is intended, different types of signals are output. In addition, there can be different measuring methods for a medium, which in turn generate and output different types of signals. For a water meter, for example, there may be mechanical flow meters which use a fundamentally different measuring method to flow meters based on ultrasonic technology.

It is possible that the raw measurement data stream has a temporal resolution which is determined or conditioned by the sensor sampling rate or measuring element sampling rate or a multiple thereof. The raw measurement data stream has a time resolution which is only determined or at least conditioned by the sensor sampling rate or measuring element sampling rate or a multiple thereof. The temporal resolution of the raw measurement data stream is preferably in the second range, tenth of a second range, hundredth of a second range or thousandth of a second range.

Advantageously, the raw measurement data stream is continuous and/or complete on the basis of the determined resolution. This results in a particularly high resolution of measured values along the continuous course of time and from this in turn a special depth of information as a basis for evaluations and calculations based on it.

In order to generate the continuous raw measurement data stream, the data packets are usefully combined in a corresponding time sequence reference or at least put in relation to each other, so that the time stampings contained in the packets are later combined again along the real time axis according to their sampling and previous packet division or at least set in a continuous time relationship to each other.

The decision when a new data transmission in the form of a message or a telegram (of one or more data packets) is to be carried out depends preferably on whether at least one of two conditions are met, namely:

(a) expiration of a specified time interval, and
(b) achieving a specified amount of time stampings since the previous transmission.

As a result, a time sequence reference of the raw measurement data packets to be transmitted can be easily implemented.

It is particularly useful that the method includes packaging the time stampings by formatting it into data packets of a predetermined fixed size, with a new transmission being triggered each time the accumulated data reaches the size of a data packet or the predetermined time interval has expired.

It is possible that the data transmission is carried out with redundancy. It is useful to achieve redundancy in transmission by sending the same data packet or time stamping repeatedly in several successive transmissions.

Advantageously, the time stampings can be compressed and the compression of the time stampings are carried out without loss. The time stampings can be compressed without loss in the area of the sensor. The transmission of the time stampings can usefully take place in compressed form via a wired link and/or via a radio link. Transmission can be repeated and conditional upon expiration of a specified time interval and/or upon reaching a specified amount of time stampings collected since a previous transmission. Thus, for example, equidistant time stampings can be determined for their transfer in a simplified manner using the method according to the invention.

Alternatively, compression of the time stampings can also be carried out with a specified, permissible loss level. If the time stamping compression is performed at a specified permissible loss level, if the user or operator prefers to save energy and accepts some inaccuracy in the restoration and reproduction of the original measurement data (i.e. accepts some loss), the compression ratio may be increased to the detriment of less accuracy in the reproduction on the receiver side. The loss ratio or compression ratio can be provided as a programmable or adjustable parameter that determines or sets the compression mode.

As illustrative and non-restrictive examples of data compression algorithms, a differential compression (delta coding) in connection with a Huffman coding, a run length coding (RLE coding) or preferably an adaptive binary arithmetic coding (CABAC coding) can be considered within the framework of the inventive method.

In addition, this invention claims a sensor. The sensor can advantageously be operated according to a method according to at least one of the method claims.

In addition, this invention claims a consumption meter. The consumption meter can advantageously be operated according to a method according to at least one of the method claims.

Furthermore, the present invention claims a temporary receiver. The temporary receiver can advantageously be operated according to a method according to at least one of the method claims.

The present invention also claims a network. Data in the network can be collected according to a method in accordance with at least one of the method claims. Furthermore on-demand analysis for network monitoring uses raw measurement data reconstructed from time stampings.

Other features which are considered as characteristic for the invention are set forth in the appended claims.

Although the invention is illustrated and described herein as embodied in a method for collecting data in a network, sensor, consumption meter, temporary receiver and network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
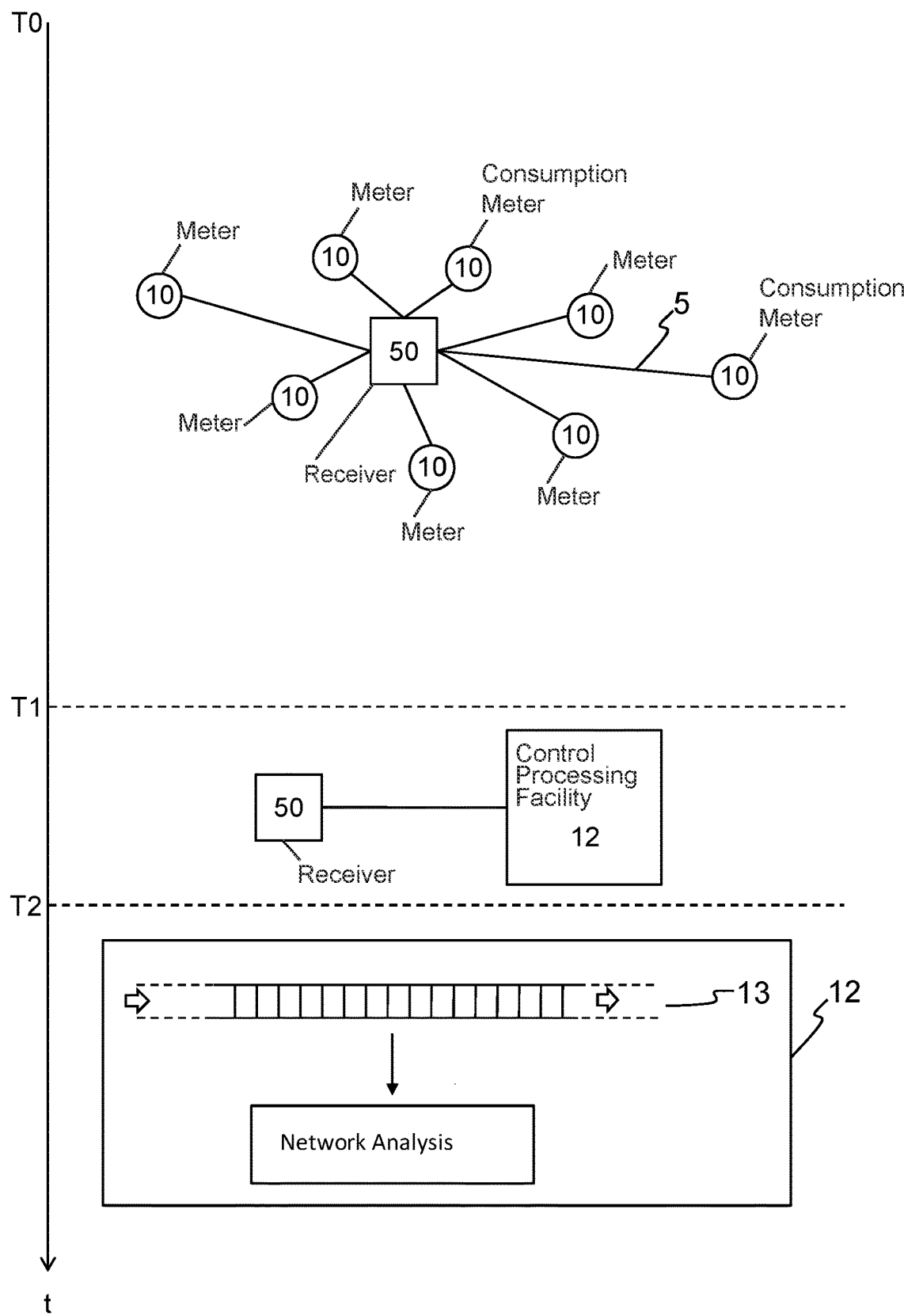
FIG. 1 is an illustration of a use of a temporary receiver for on-demand network analysis.

Referring now to the figures of the drawings in detail and first, particularly to FIG. 1 thereof, there is shown a temporary receiver 50 for on-demand network analysis. During a certain period of time between T0 and T1, for example 3 months, a temporary receiver 50 is operated in a certain area. In this area there are a number of consumption meters 10, each of which contains a sensor 1. The consumption meters 10 send time stampings TS to the temporary receiver 50 via a primary communication path 5. The received time stampings TS are stored in the temporary receiver 50. After T1, the temporary receiver 50 is brought to the remote central processing facility 12, where it is read out on site via cable connection or radio connection. The time periods from T0 to T1 and T1 to T2 are not drawn to scale. The time span T0 to T1 can be much longer than the time span T1 to T2. After T2, the data read out by the receiver, in particular the time stampings TS, are analyzed and evaluated in the remote central processing facility 12. For example, a raw measurement data stream 13 can be generated from the time stampings TS. The raw measurement data stream 13 can be used to analyze the network.

Figure 2A:
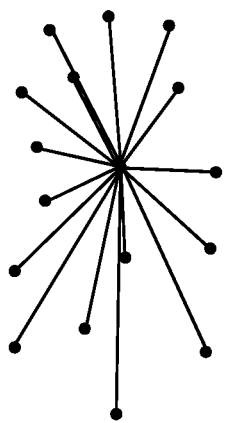
FIGS. 2A-2C are simplified illustrations showing examples for centralized, decentralized and distributed networks.
Figure 2B:
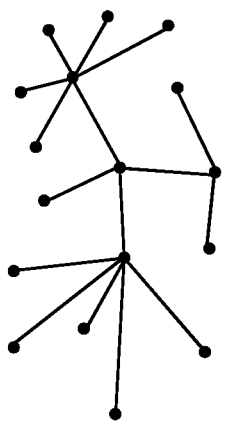
Figure 2C:
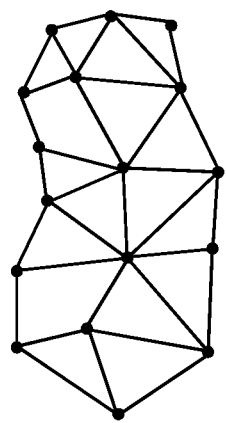

FIGS. 2A-2C show different network configurations. FIG. 2A shows a centralized network with one central node from which all other nodes are served. The decentralized network shown in FIG. 2B does not have one central node but several nodes with equal rights. In the distributed network or mesh network shown in FIG. 2C the infrastructure nodes connect directly, dynamically and non-hierarchically to as many other nodes as possible. The method of the present invention can be applied to every network configuration.

FIGS. 3A to 3F and FIG. 4 show supply networks for the distribution of consumable goods, e.g. gas, electricity, water or heat. The supply networks comprises a large number of individual local consumption meters 10, which can, for example, be assigned to different residential units of an apartment building. The individual consumption meters 10, e.g. water meter, electricity meter, heat meter or gas meter, are connected via a wireless communication link to other nodes in the network, e.g. a data collector 3, which can function as a master or a concentrator.

Figure 3A:
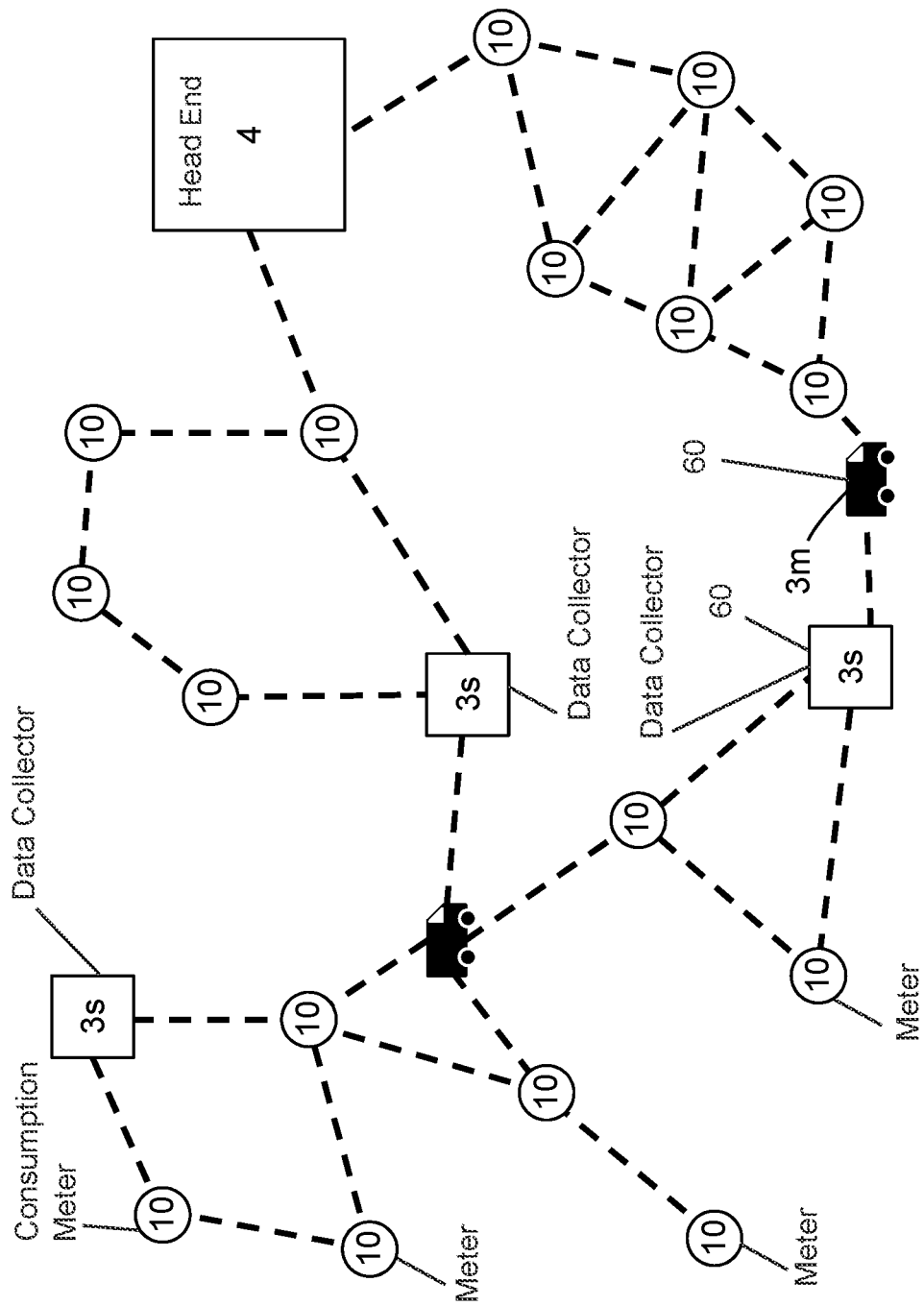
FIGS. 3A-3F are very simplified schematic representation of a mesh network with temporary transceivers in different network configurations.

FIGS. 3A to 3E show a network consisting of a plurality of consumption meters 10, three stationary data collectors 3s, two mobile data collectors 3m and a Head End 4. The network is configured as a mesh network, so that the consumption meters 10, the stationary data collectors 3s, the mobile data collectors 3m and the head-end 4 represent the nodes of the network. As nodes in a network, one of their tasks is to act as transceivers in the network. This enables them to receive and forward data from other transmitters in the network. In addition, data can also be sent out, which can be received and forwarded by other transceivers in the network, for example. The configuration of the network in FIG. 3A represents any temporal starting point at which the mobile data collectors 3m are located, for example, at the marked points.

If a permanent radio link to a sensor 1 and/or a consumption meter 10 is not available, it is advantageous to use nodes 3m/3s of the network as temporary transceivers 60. This ensures 100 percent or almost 100 percent availability of the individual sensors 1 or consumption meters 10 in the network.

Figure 3B:
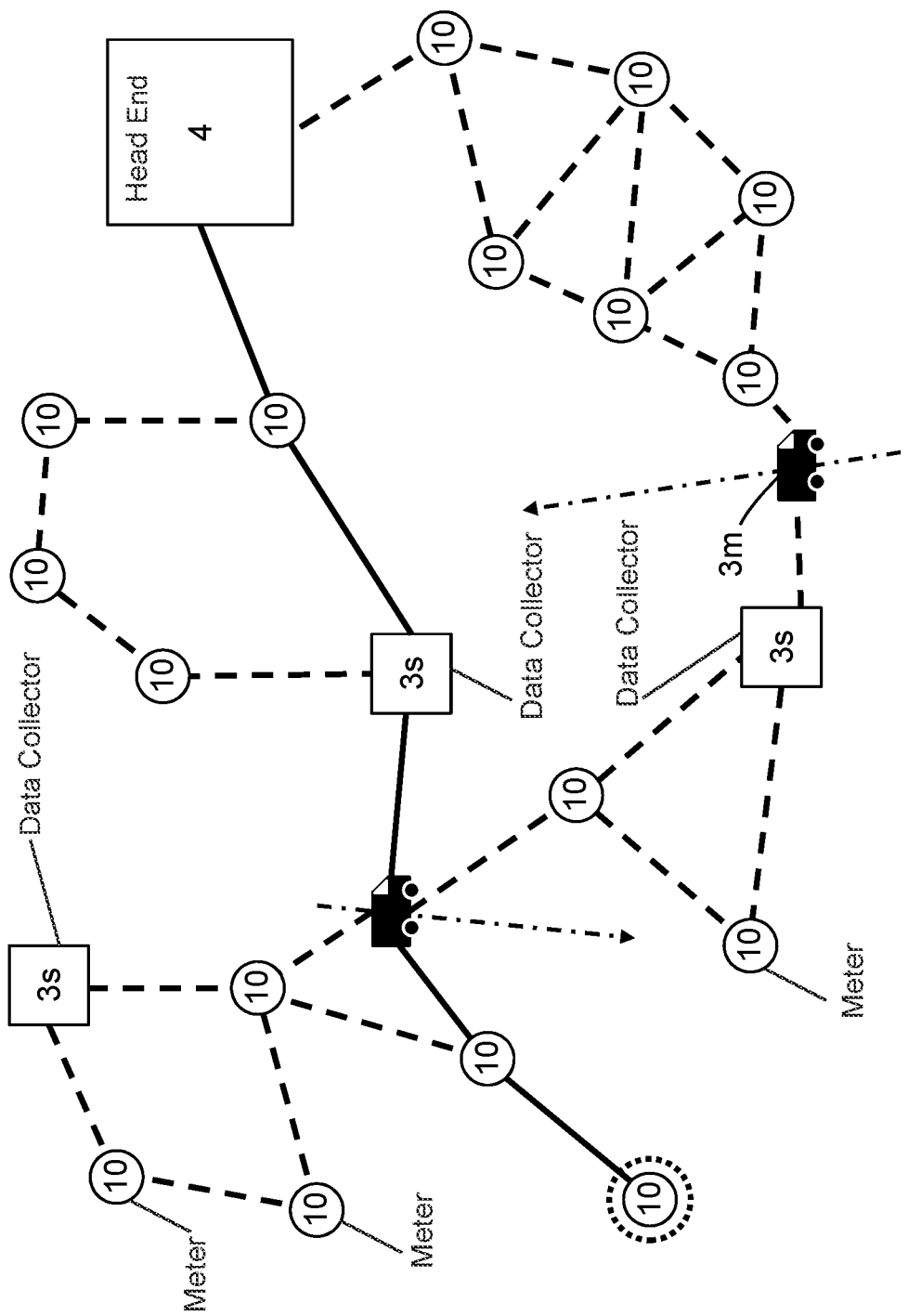

Data transfer in the network, preferably in the form of time stampings TS, is shown in FIG. 3B. The highlighted consumption meter 10 sends data, in particular time stampings TS, to the head end 4. The transceivers, such as consumption meters 10 and/or data collectors 3s/3m, in the immediate vicinity of the respective consumption meter 10 are used to forward the data stream. The information or data transfer therefore only takes place temporarily via corresponding transceivers. When choosing transceivers, it is advantageous to consider the position of the respective transceivers with regard to the starting point and the end point of the data transfer. Furthermore, the quality of the radio connection from and to the respective transceiver or its accessibility can also be taken into account. The information transfer within the network can therefore be realized by a cascade of temporary transceivers 60.

The mobile data collectors 3m in FIG. 3B are on a service run, which is indicated by the arrows. Depending on the current position of the mobile data collector 3m, the path of the time stampings TS through the network is selected. The possible connections that the mobile data collectors 3m can make depend on their current position.

Figure 3C:
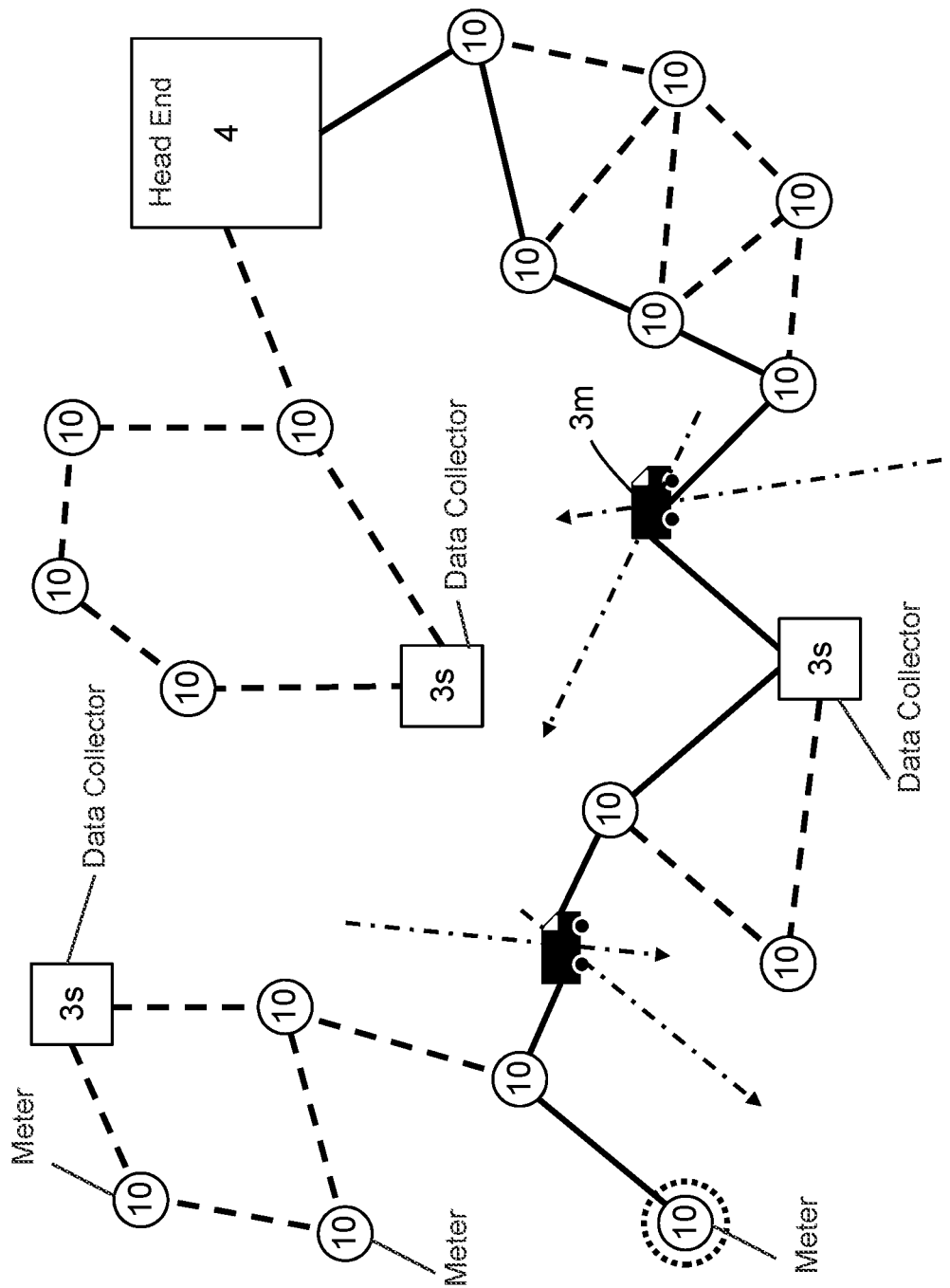
Figure 3D:
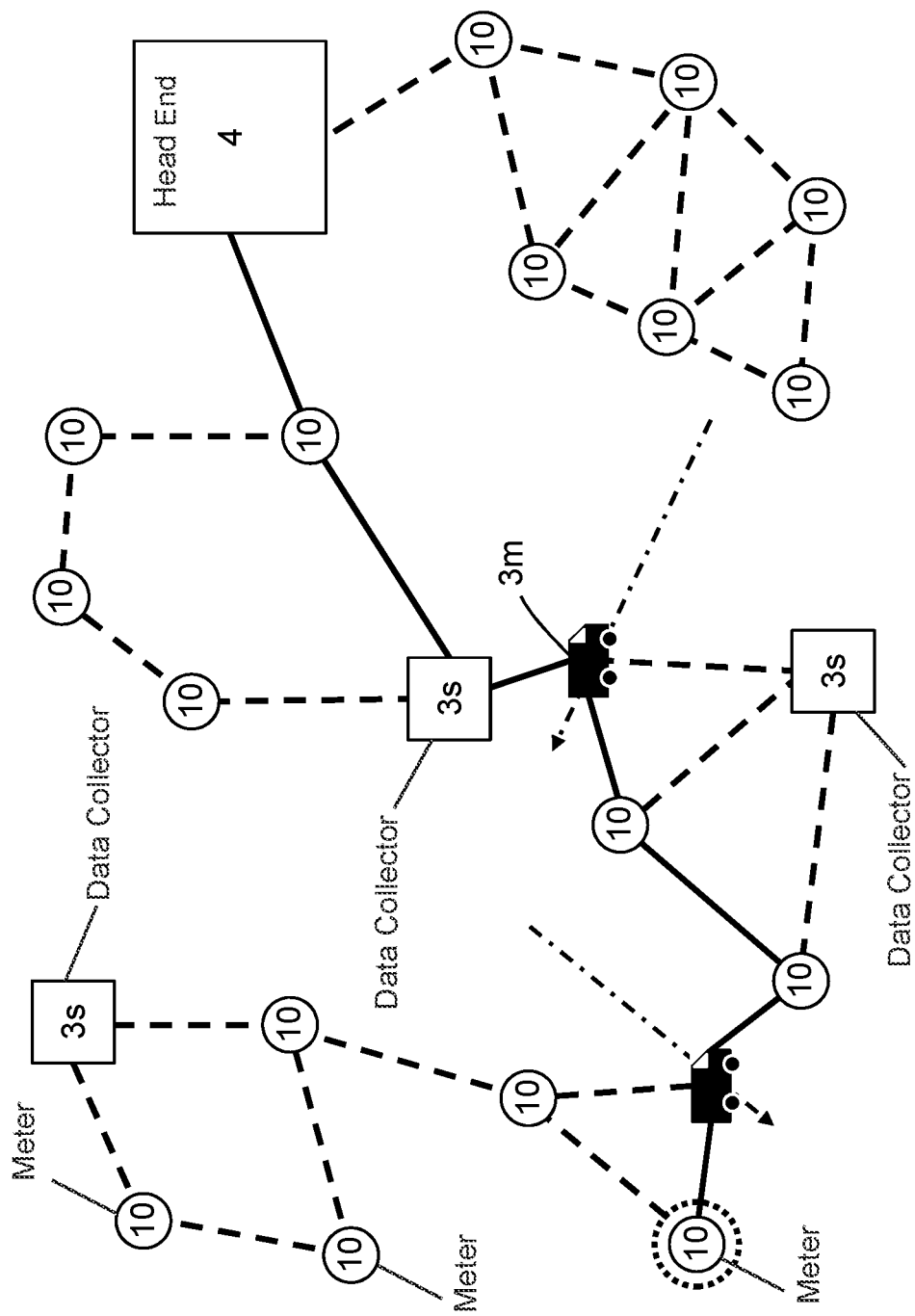

During their service run the mobile data collectors 3m are at the positions shown in FIG. 3C at a certain time. This affects the path of the time stampings TS from the highlighted consumption meter 10 to the head end 4. The time stampings TS are now routed via another path, which contains both mobile data collectors 3m. It is possible that the transfer of the time stampings TS is not interrupted while the mobile data collectors 3m are in motion. This enables a continuous stream of raw measurement data 13 reconstructed from the time stampings TS in the mesh network. In the further course of the service run, for example, the constellation of mobile data collectors 3m to the consumption meters 10 and the stationary data collectors 3s changes to the configuration shown in FIG. 3D. In this configuration, the time stampings TS of the highlighted consumption meter 10 are routed to the head-end 4 via a different path. The shortest paths are advantageously found autonomously by the mesh network. Even when switching between different paths in the mesh network, the transfer of the time stampings TS between the source transceiver, e.g. the highlighted consumption meter 10, and the target transceiver, such as the head-end 4, is not interrupted.

Figure 3E:
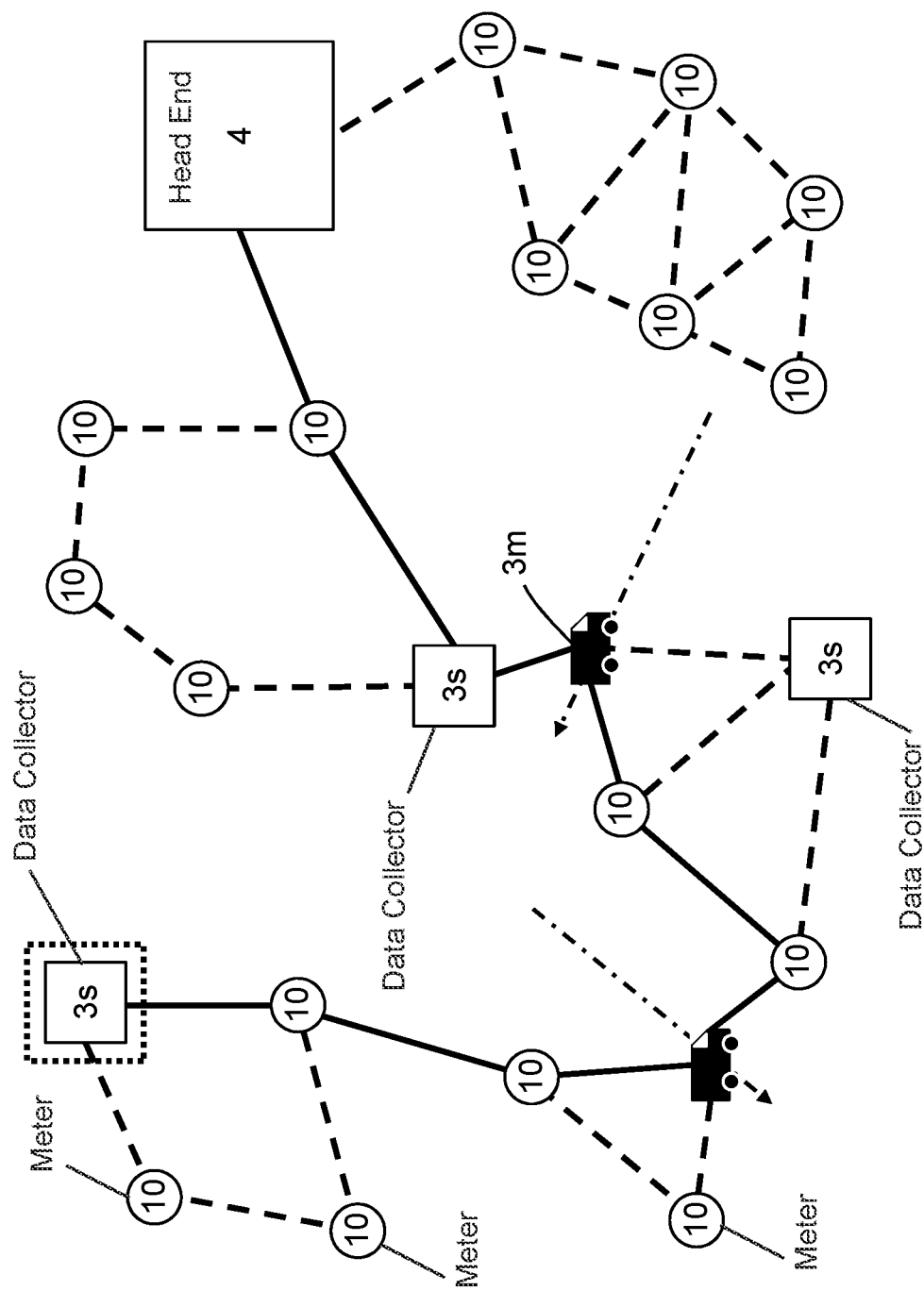

Additional data streams can also be routed through the network. FIG. 3E shows the data stream of the highlighted stationary data collector 3s. The path of this data stream also leads via both mobile data collectors 3m to the head-end 4. The stationary data collectors 3s can serve as transceivers for surrounding consumption meters 10 and/or temporarily store the received time stampings TS of the consumption meters 10 and forward them as required, e.g. to the head-end 4. Due to the configuration of the mobile data collectors 3m, the highlighted stationary data collector 3s can send the temporarily stored time stampings TS of the consumption meters 10 to the head-end 4.

Figure 3F:
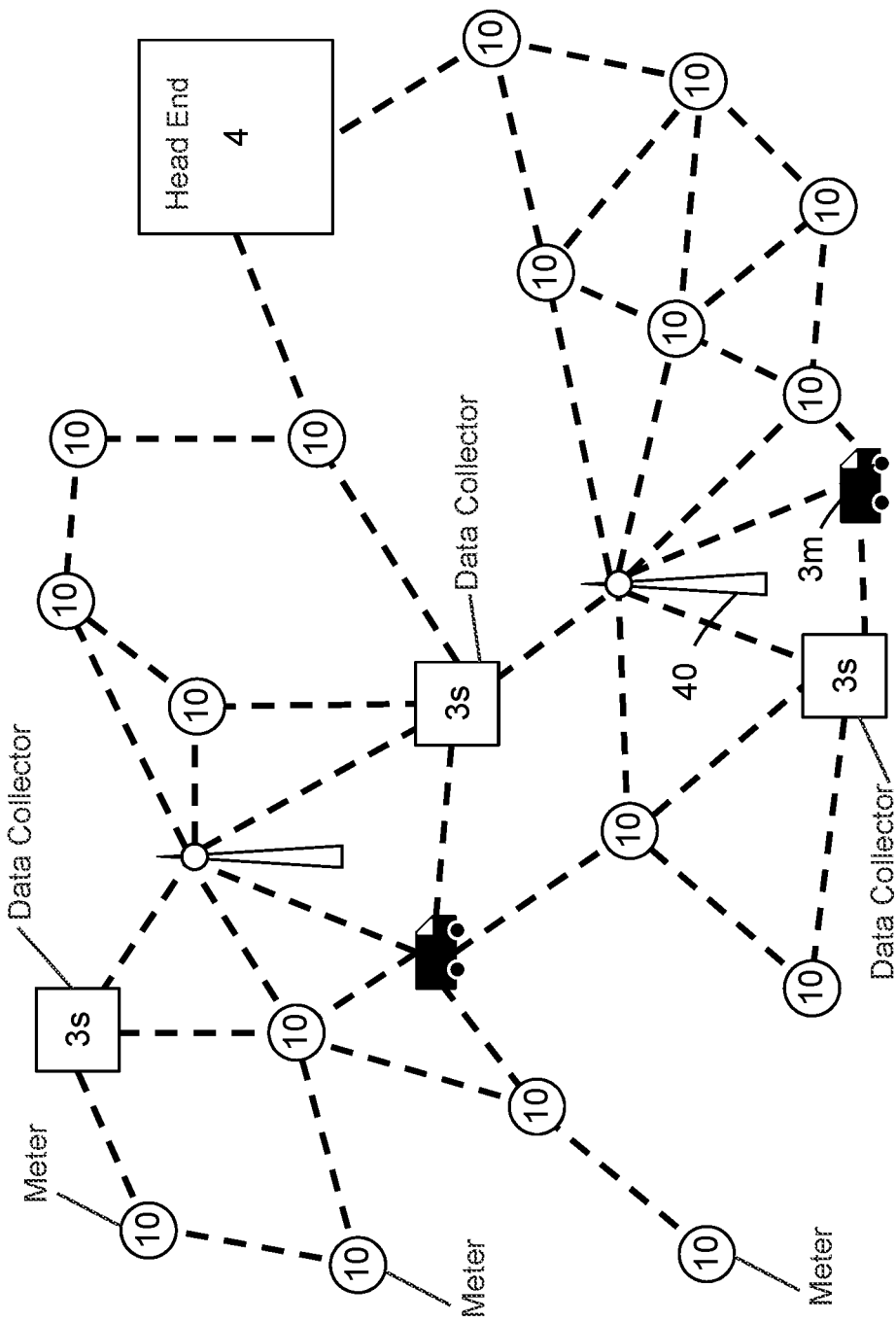

In FIG. 3F the mesh network additionally comprises two radio towers 40 which act as nodes or transceivers in the network. Surrounding consumption meters 10 and stationary 3s and mobile data collectors 3m are connected to the radio towers 40. The radio towers 40 forward the information and data, especially time stampings TS to the next node or transceiver. Unlike data collectors 3, the primary purpose here is not to store data, but to forward it reliably. Radio towers 40 can also close gaps between nodes in the network without the need for a data collector 3.

Figure 4:
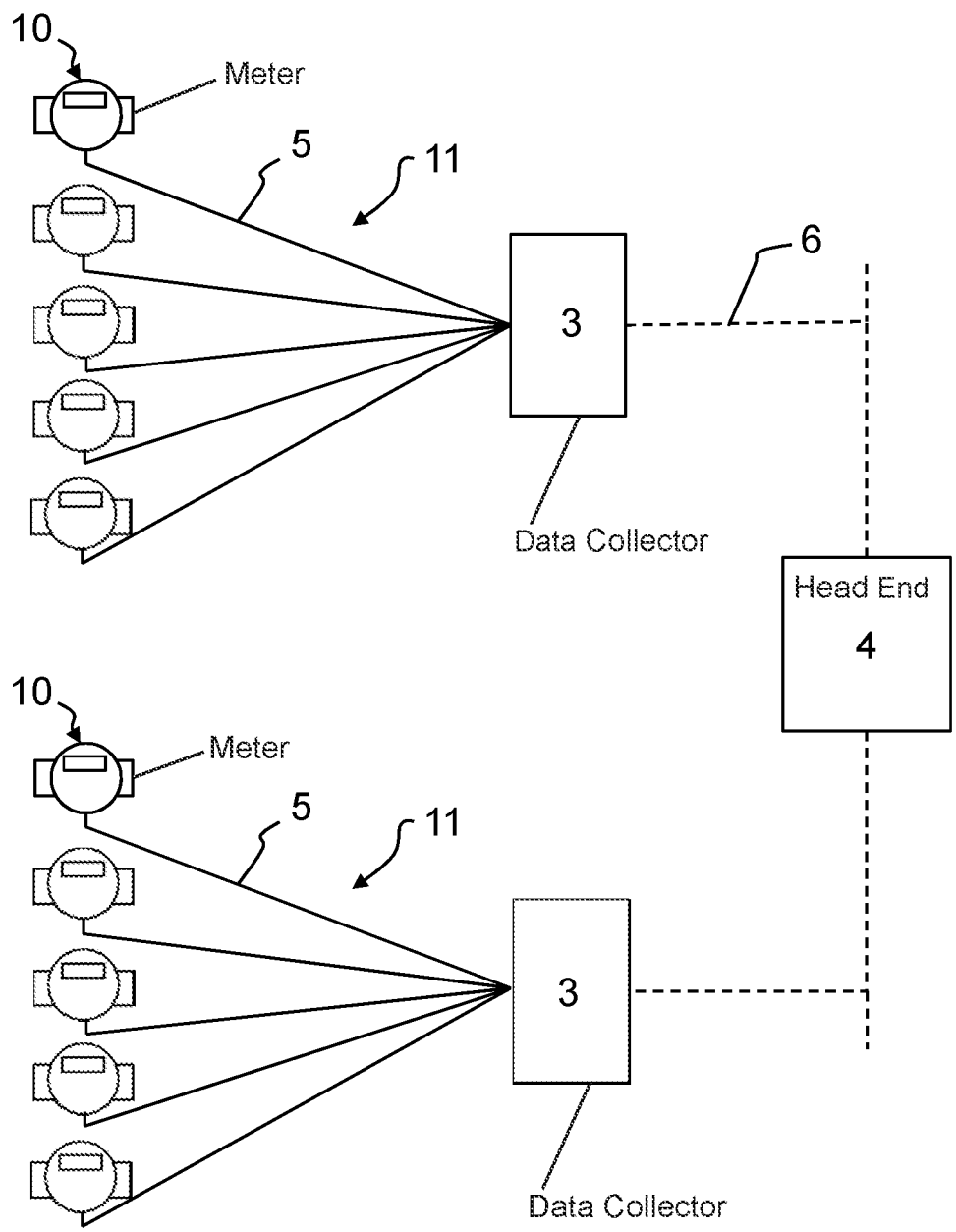
FIG. 4 is a very simplified schematic representation of an example of communication links in a supply network for collecting and/or forwarding data collected by a large number of consumption meters to a data collector and a head-end.

It is possible that the network is structured hierarchically. In FIG. 4 a hierarchically structured network for the distribution of consumable goods or consumables, e.g. gas, water, electricity, fuel or heat is shown. Here it is advisable for the local consumption meter(s) 10 to be connected to the data collector 3 via a primary communication path 5. The respective data collector 3 is connected to a head-end 4 via a tertiary communication path 6. The data of the entire supply network is collected in the head-end 4. The tertiary communication link 6 can be a wired communication link or a communication link based on radio technology (e.g. mobile radio communication link). Alternatively, the data of the respective data collector 3 can also be read out by a portable reading device if required and read in again at the head-end 4. The data can be transmitted along the tertiary communication path 6 in different ways, for example via LAN, GPRS, LTE, 3G, etc. The entire network may be configured as a smart grid. Smart grids combine generation, storage and consumption, whereas a central control system coordinates them optimally to each other.

The individual consumption meters 10 can be operated with an independent power supply (rechargeable battery).

Figure 5:
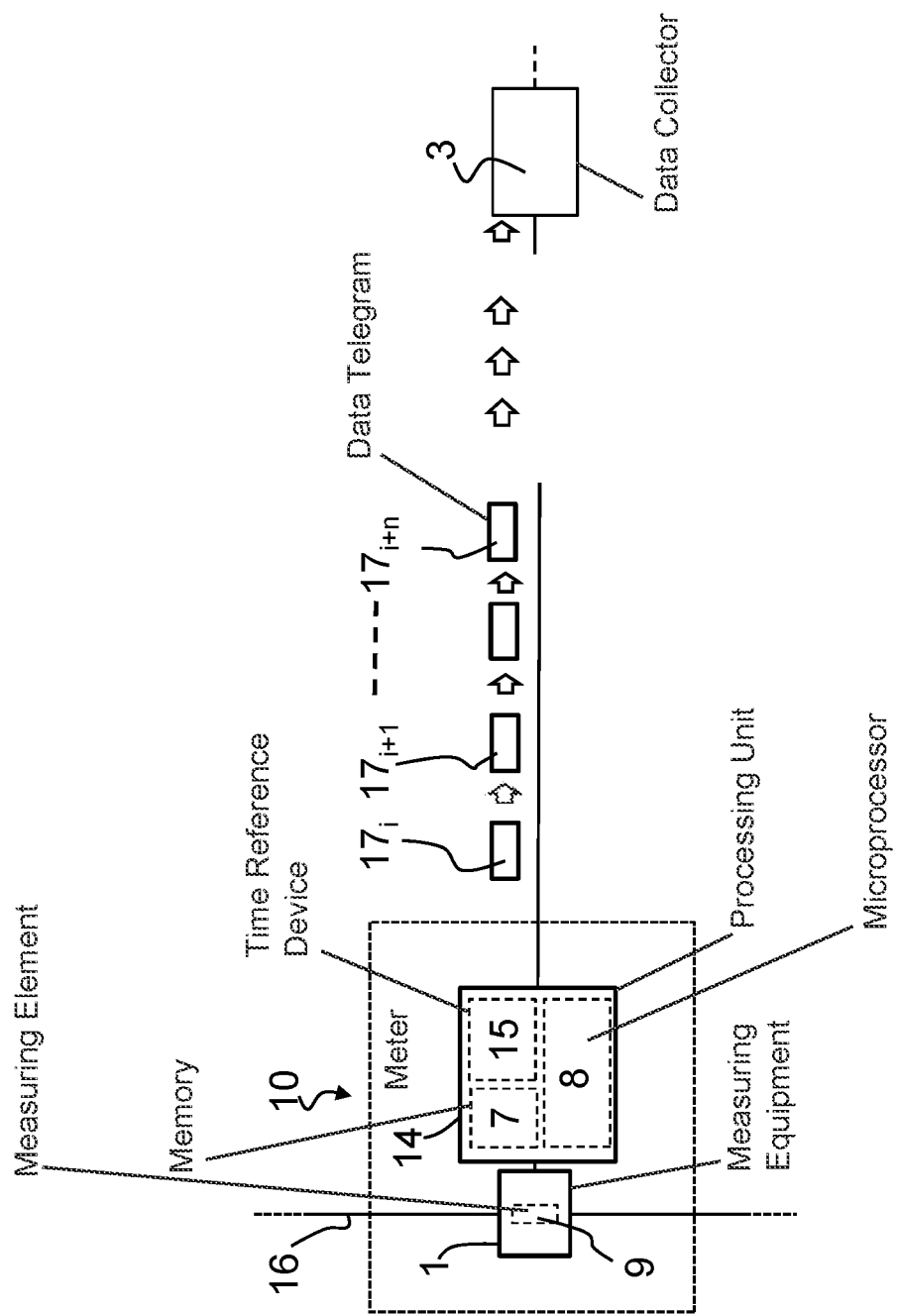
FIG. 5 is a simplified schematic representation of an example of the transmission of raw measurement data of characteristic time stampings to another transceiver, e.g. a data collector.

According to FIG. 5, the respective consumption meter 10 contains a sensor 1 equipped with at least one measuring element 9. The sensor 1 is to be used to generate raw measuring data via the measuring element 9, which are fed to a measuring data processing unit 14. The raw measurement data correspond to elementary measuring units supplied by measuring element 9 of at least one physical or physicochemical quantity or of at least one physical or physicochemical parameter. The raw measurement data can, for example, be raw data in connection with the flow of a medium through a supply line 16, e.g. water pipe, in particular the flow rate, turbidity, the presence of pollutants or the presence of a solid and/or gaseous component or solid and/or gaseous components.

The measurement data processing unit 14 of the consumption meter 10 comprises memory means 7, a time reference device 15 (quartz) and a microprocessor 8. The aforementioned components can be provided separately or as integrated total components.

According to the invention, the following subsequent steps are carried out in the area of the respective consumption meter 10:

Triggering a time stamping TS when one physical or physicochemical value or at least one physical or physicochemical parameter is recorded.

Storage of the time stampings TS in the memory means 7 of the sensor 1 and/or the consumption meter 10.

Transmission of the time stampings TS, preferably in compressed form, over a radio link 11 by preparing data telegrams $17_i$, $17_{i+1}$, $17_{i+n}$ in the measurement data processing unit 14, which are successively transmitted to a remote central processing facility 12, e.g. a head-end 4. The compression of the time stampings TS is performed by the microprocessor 8.

Accordingly, data telegrams $17_i$, $17_{i+1}$, ..., $17_{i+n}$ are transmitted in sequence, which contain continuous time stampings TS. From these time stampings TS a continuous uninterrupted raw measurement data stream 13 of very high resolution can be reconstructed on the receiver side using the correlation model.

Figure 6:
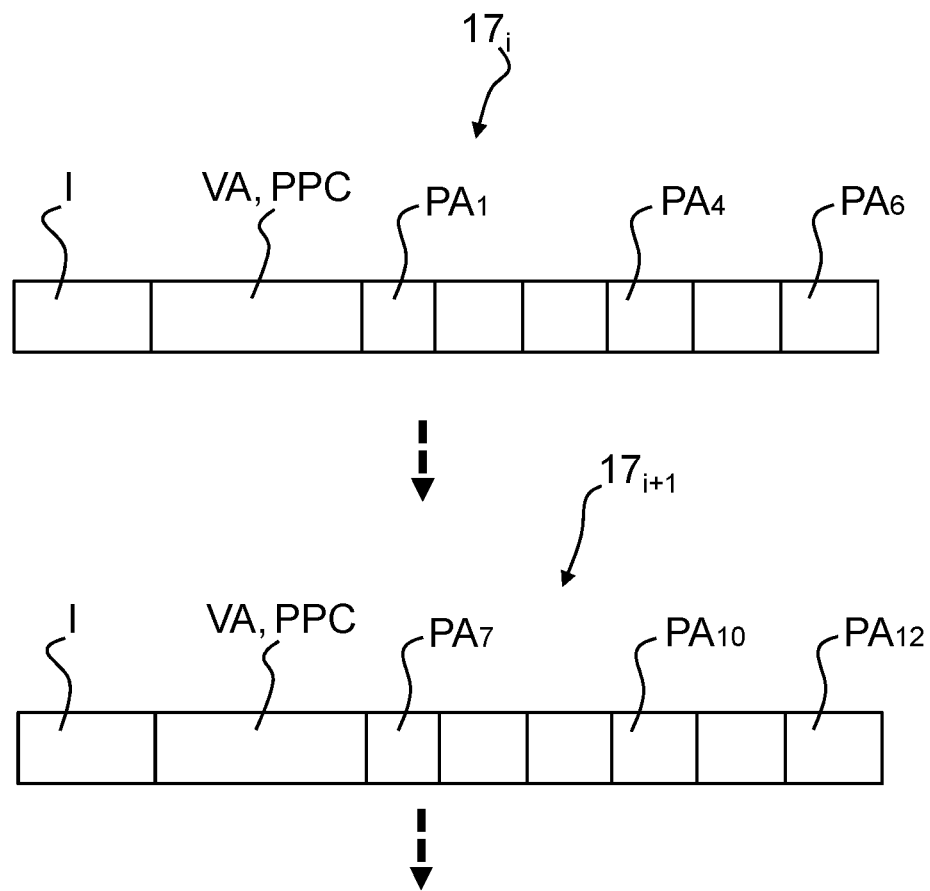
FIG. 6 is an illustration showing an example of a message structure which is emitted or queried by the measurement data processing unit of the consumption meter.

As shown as an example in FIG. 6, the identity (address) I of the respective sensor 1 and/or the absolute or cumulative value VA of the physical or physicochemical quantity or parameter measured by the respective sensor 1 in the respective data telegram $17_i$, $17_{i+1}$, ..., $17_{i+n}$ can be transmitted together with the $PA_j$ packets of the time stampings TS, whereby the value VA can be provided with a time stamp or assigned to one of the elementary time-stamped measurement data, for example an index value of a fluid meter. The value VA can be—according to the example—for example, the meter reading of a water meter at a certain time or the flow rate through the water meter since a previous data transmission (e.g. the sum Σ of the time stampings $TS_i$ corresponds to the sum Σ of the flow volume; see FIG. 7).

The method may also consist in using the $PA_j$ packets of raw measurement data to read and transmit the value of at least one other physical or physicochemical parameter PPC of the environment of the sensor 1 concerned or of the fluid measured by the latter at a given time, such as the conductivity of the fluid, the temperature of the fluid, the pH of the fluid, the pressure of the fluid, and/or a parameter characterizing the quality and/or the composition of the fluid and/or the temperature of the installation environment of sensor 1.

FIG. 6 shows the individual data telegrams $17_i$, $17_{i+1}$, ..., $17_{i+n}$ according to FIG. 5 in somewhat more detail. The data telegrams $17_i$, $17_{i+1}$, ..., $17_{i+n}$ each comprise a plurality of data packets $PA_1$-$PA_6$ or $PA_7$-$PA_{12}$, the absolute or cumulative value VA and the value of at least one other physical or physico-chemical parameter PPC of the environment of the respective sensor 1 or of the fluid measured by the latter at a certain time, such as the conductivity of the fluid, the temperature of the fluid, the pH of the fluid, the pressure of the fluid, a parameter characteristic of the quality and/or composition of the fluid and/or the temperature of the installation environment of sensor 1.

As shown as an example in FIG. 6, the compressed raw measurement data can be packed by formatting the $PA_j$ packets, the size of which must not exceed a predetermined maximum value, whereby each time the accumulated data reaches the size of a packet $PA_j$, a new packet or telegram is formed or a new transmission is triggered, provided that the predetermined time interval has not previously expired.

According to a preferred variant of the invention, the time stampings TS are compressed before being transferred. The time stampings TS can be compressed with no loss.

Alternatively, the time stampings TS compression can also be carried out with a specified permissible loss level. In fact, if the user or operator prefers to save energy and accepts a certain inaccuracy in the restoration and reproduction of the original measurement data (i.e. accepts a certain loss), the compression ratio may be increased to the detriment of less accuracy in the reproduction on the receiving side. This loss ratio or compression ratio can be provided as a programmable or adjustable parameter that determines or sets the compression mode.

As illustrative and non-restrictive examples of data compression algorithms, a differential coding (delta coding) in connection with a Huffman coding, a run length coding (RLE coding) or preferably an adaptive binary arithmetic coding (CABAC coding) can be considered within the framework of the inventive method.

Preferably, the time stampings TS in memory means 7 of consumption meter 10 are not deleted until the transmission of the time stampings TS has been confirmed by a receiver, a transceiver, a network node or a data collector 3.

Thanks to the invention, it is possible to have information at the data collector 3 or the receiving location (e.g. head-end 4) which enables a faithful and complete reconstruction from the time stampings TS which is true to the original of all raw measurement data supplied by the various sensors 1 in very high temporal resolution and allows unlimited flexibility in the evaluation of this data. In this way, the expandability of "business" functions can be easily and centrally taken into account without influencing the functionality or even the structure of modules (sensors, means of communication, and the like).

The design of the sensor 1 can be simpler and its operation more reliable than previously known solutions. Furthermore, the energy consumption of the assembly consisting of the sensor 1 and the communication means is lower than in the current versions of consumption meters 10, which evaluate the data locally.

The expert understands of course that the invention can be applied to the measurement and remote reading of various parameters and sizes: It is sufficient to be able to accurately date an elementary change (measurable by sensor 1) of a parameter or a size in accordance with the resolution of the targeted sensor 1 (the time-stamped elementary variation can correspond to the resolution of the sensor or possibly a multiple of this resolution).

In connection with an advantageous application of the invention, associated with the concept of consumption, it may be provided that the or one of the measured physical quantity(s) refers to a flow medium, each time stamping corresponding to an elementary quantity of fluid which is measured by sensor 1, depending on its measuring accuracy. The measured fluid can be, for example, gas, water, fuel or a chemical substance.

Alternatively or cumulatively to the above mentioned variant, the invention may also provide that the or one of the measured physicochemical quantity(s) is selected from the group formed by the temperature, pH, conductivity and pressure of a fluid flowing through or contacted by the sensor 1 concerned.

If, alternatively or cumulatively, at least one parameter is measured, this or one of these measured physical or physicochemical parameter(s) may be characteristic of the quality and/or composition of a fluid flowing through or coming into contact with the relevant sensor 1, such as turbidity, the presence of pollutants or the presence of a solid and/or gaseous fraction or solid and/or gaseous fractions.

The above sizes, units and parameters are, of course, only examples that are not restrictive.

With a 100% quality network, redundancy is not required. Therefore, preferably the time stampings TS are transmitted without redundancy from the respective consumption meter 10 or sensor 1 to a data collector 3. This means that no repeated transmission of the raw measurement data is necessary. The advantage of this is that considerably less data has to be transmitted. However, if redundancy is required in the network, it may be achieved by sending the same data packet $PA_j$ or time stamping TS repeatedly in several successive transmissions.

Accordingly, data telegrams 17 are continuously formed at a certain point in time and successively transmitted. The individual data packets $PA_1, \ldots, PA_n$ then form a continuous time-stamped raw measurement data stream 13.

Figure 7:
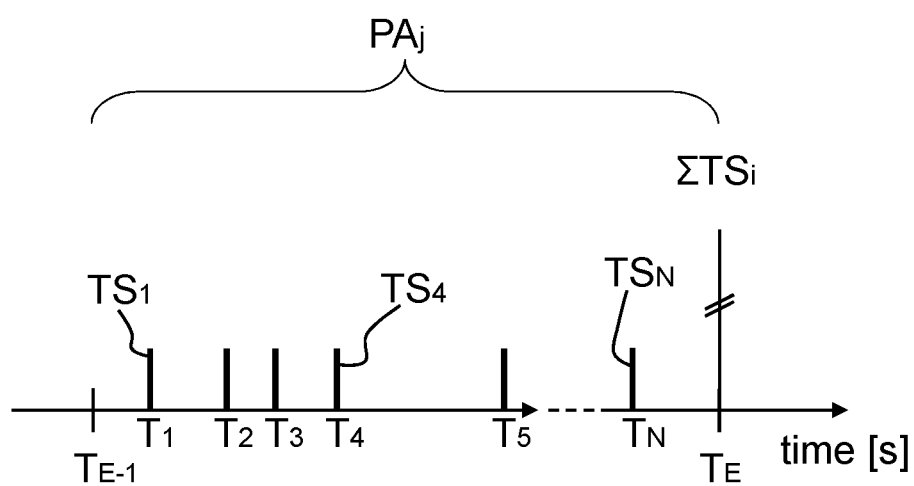
FIG. 7 is an illustration of an example of a chronogram of time stampings of the raw measurement data read out by a sensor between two uplink transmission processes (messages or telegrams emitted at times $T_{E-1}$ and $T_E$), in a context of remote reading of the volume consumption (in this case, the package $PA_j$ contains N time stampings $TS_N$)

FIG. 7 shows an example of a message structure transmitted from sensor 1 or consumption meter 10 to another transceiver, e.g. a data collector 3. Each time stamping $TS_1$ to $TS_N$ corresponds according to the correlation model, for example, to an elementary quantity of fluid, which is measured by sensor 1, depending on its measuring accuracy. The measured fluid can be, for example, gas, water, fuel or a chemical substance. In the time interval $T_{E-1}$ to $T_E$, N pulses are measured and the time stampings $TS_1$ to $TS_N$ are stored, which, with a quantity of, for example one liter per time stamping TS, corresponds to a total flow rate of N liters within this time interval. The measurement data processing unit 14 generates a data package $PA_j$ which contains N time stampings $TS_1$ to $TS_N$. Data telegrams $17_i$, $17_{i+1}$ are formed according to FIG. 6 from the plurality of data packets, for example $PA_1$ to $PA_6$ or $PA_7$ to $PA_{12}$.

In order to adapt the procedure according to the invention to changes in the development of the parameter or the measured variable and at the same time to ensure a satisfactory update of the available instantaneous data, the procedure may advantageously consist, in particular, of forming a new packet or telegram or of carrying out a new data transmission in the form of a message or telegram as soon as at least one of the following two conditions is fulfilled:

(a) a predetermined time interval has elapsed, and
(b) a predetermined amount of compressed collected data or time stampings TS has been reached since the previous transmission.

The application of condition (b) may consist, for example, in periodically checking the size of all new data in compressed form or time stampings TS after a specified number of new raw measurement data has been read. If these sizes are close to a critical size, for example close to the size of a packet specified by the transmission protocol, a new transmission is performed (condition (b) is met before condition (a)) unless the specified time interval between two successive transmissions has expired first (condition (a) is met before condition (b)).

The method consists, therefore, preferably, if at least one of the conditions is fulfilled (they may exceptionally also be fulfilled simultaneously), in transmitting the compressed and formatted time stampings TS of each sensor 1 or consumption meter 10 concerned to the next transceiver, e.g. a data collector 3. A data collector 3, for example, manages a local network of a plurality of consumption meters 10 or sensors 1 assigned to it. From a data collector 3, the compressed and formatted time stampings TS together with the compressed and formatted raw measurement data of each of the other consumption meters 10 or sensors 1 that are part of the supply network are transmitted to the head-end 4.

The data collector 3 can store the time stampings TS retrieved from the respective sensors 1 and/or consumption meters 10 either over a time interval (e.g. one day) and then forward it to a processing location or to the head-end 4. Alternatively, the data can also be transferred immediately from the data collector 3 to the head-end 4.

Figure 8:
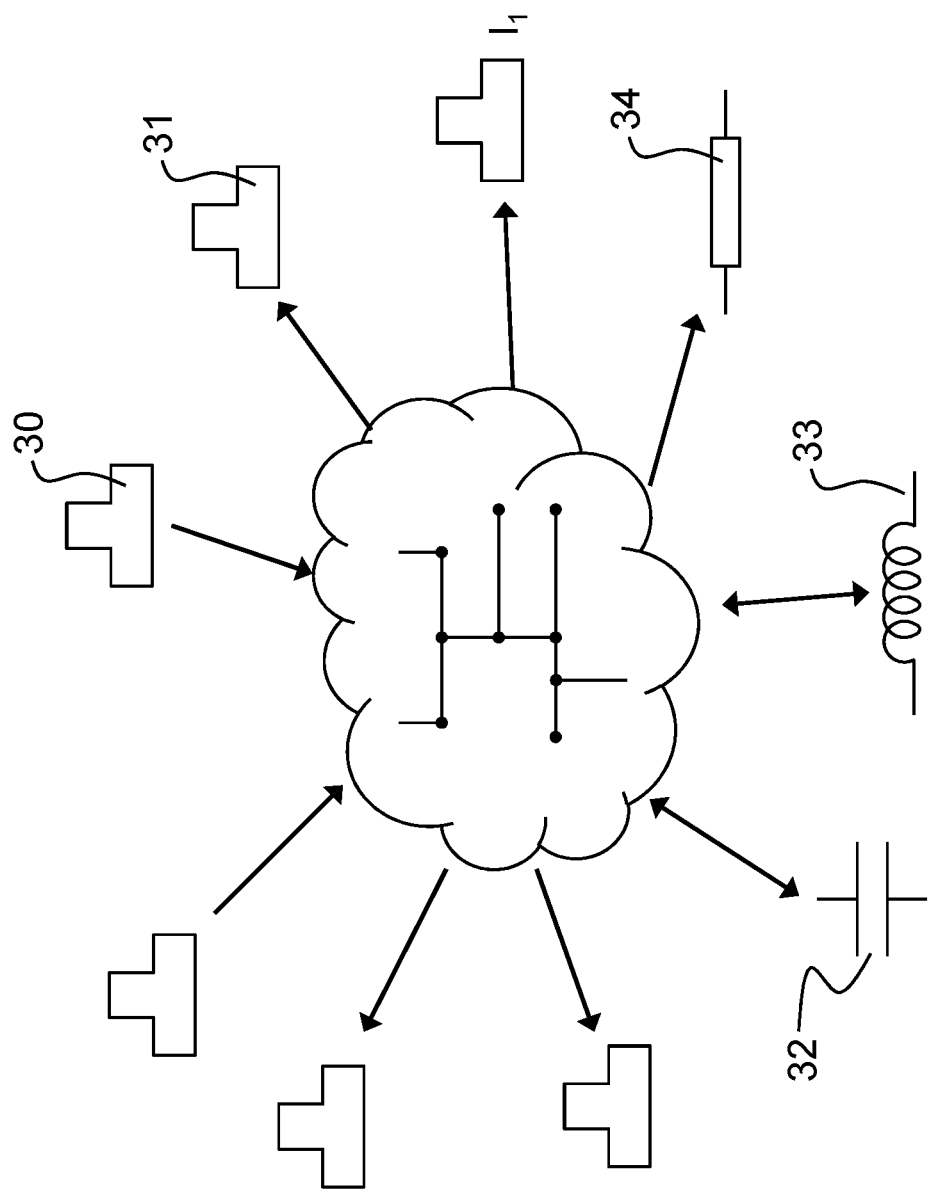
FIG. 8 is a very simplified schematic representation of a network (in this case, for example, a water network) with various inflows and outflows.

In FIG. 8 a snapshot of the network is shown. The network can be, for example, a water network with several inflows 31 and outflows 30. The outflow 30 could also be designed as an endpoint, such as a sensor 1 and/or a consumption meter 10. Each sensor 1 and/or a consumption meter 10 is provided with an individual index $I_i$. At the outflow 30 the flow rate I is greater than zero by convention ($I_{out}>0$). The inflow 31 provides water to the system or respectively to the network. By convention the flow rate I at an inflow 31 is less than zero ($I_{in}<0$). The network further comprises a buffer vessel 32. The task of the buffer vessel 32 includes supply or storage of the distribution product, in this case e.g. water. In addition, fluctuations in the distribution product can occur in the network. In the case of water as a distribution product, this can have an effect, for example, in the form of pressure fluctuations 33. Due to pressure fluctuations 33, parameters of the system or respectively the network may change. Furthermore leaks 34 can occur in the network. The flow rate I of a leakage 34 is greater than zero by convention ($I_{leak}>0$).

At the time $T_0$ a snapshot of the network is taken, in order to determine the index of an individual sensor 1 and/or consumption meter 10. The index of an individual sensor 1 and/or consumption meter 10 at the time $T_0$ is given as $I_{i,T_0}$. Moreover at a given time $T_0$, the known index of the consumption meter 10 is $I_{i,T_0+\delta T_0}$ where $\delta T_0$ is the closest previous period of time. The decomposition at the first order for index extrapolation is given as $$I_{i,T_0} = I_{i,T_0+\delta T_0} + \frac{\partial I_i}{\partial t}\bigg|_{*T_0+\delta T_0}^{\delta T_0}.$$

At the time T1 an additional snapshot of the network is taken. The index extrapolation at the time $T_1$ is given as $$I_{i,T_1} = I_{i,T_1+\delta T_1} + \frac{\partial I_i}{\partial t}\bigg|_{*T_1+\delta T_1}^{\delta T_1}.$$

To determine the consumption throughout the system, in particular water consumption during the time period $\Delta T$ from $T_0$ to $T_1$ the volume can be calculated as $$V_{i,\Delta T} = I_{i,T_1} - I_{i,T_0} = I_{i,T_1+\delta T_1} - I_{i,T_0+\delta T_0} + \left[\frac{\partial I_i}{\partial t}\bigg|_{*T_1+\delta T_1}^{\delta T_1} - \frac{\partial I_i}{\partial t}\bigg|_{*T_0+\delta T_0}^{\delta T_0}\right],$$

whereas $\Delta T = T_1 - T_0$. By convention, a volume value greater than zero ($V_{i,\Delta T} > 0$) provides water to the system; a volume value smaller than zero ($V_{i,\Delta T} < 0$) gets water out of the system, for instance by a consumption meter 10 or domestic meter at an end point 30. According to the continuity equation $\Sigma_{i,\Delta T} V_i = 0$, the sum of all inflows and outflows to and from the network is zero. The signs of inflows and outflows must be considered in accordance with the convention, so that, for example, a leak gives a negative contribution to the sum.

Figure 9:
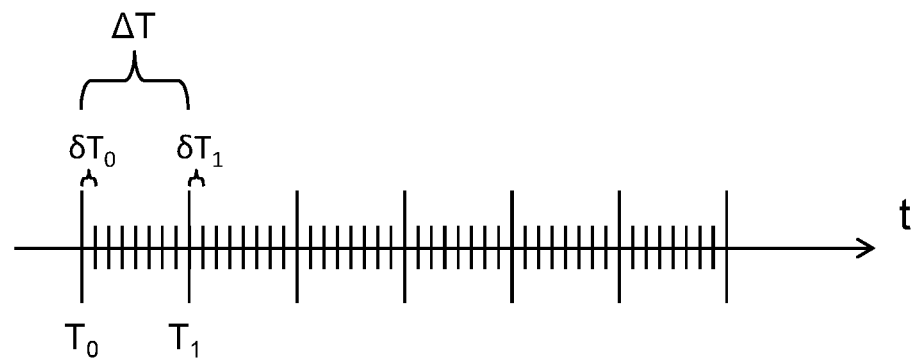
FIG. 9 is an illustration of an example for different time scales $\Delta T$ and ST.

In FIG. 9 the relation between $T_0$ and $T_1$ is shown. The infinitesimal time intervals $\delta T_0$ and $\delta T_1$ are used for index extrapolation. In order to extrapolate the current value of $I_{i,T_0}$ or respectively $I_{i,T_1}$ the intervals $\delta T_0$ and $\delta T_1$ need to be infinitesimal ($\delta T \ll 1$). The claim that a previous measured value is infinitesimal before the current measured value is not fulfilled by the state of the art. This requires high temporal accuracy or granularity, which is what this invention offers. Therefore, a more accurate extrapolated index may be provided due to the use of time stampings TS.

Figure 10:
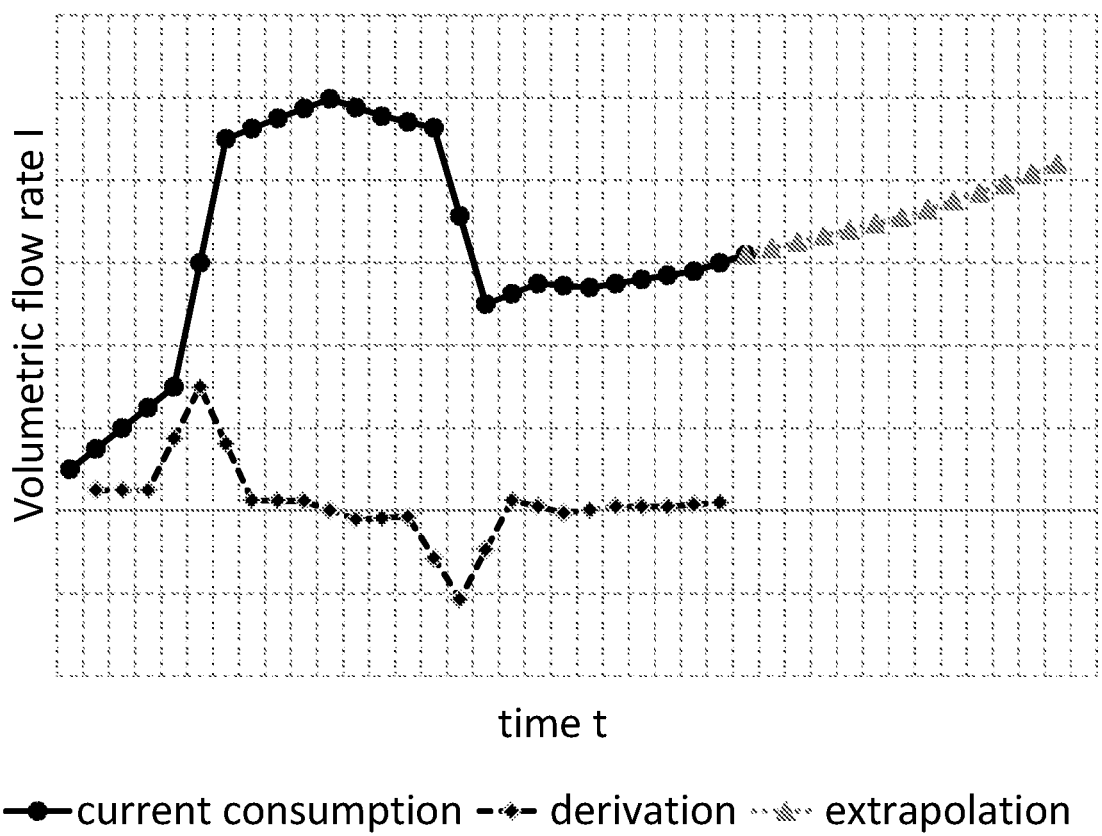
FIG. 10 is an illustration of an example of a diagram showing a current consumption, derivation and extrapolation of consumption.

FIG. 10 shows the current consumption in the network as flow rate I over time t. The time derivative of the current consumption is also shown. Based on the current consumption and the time derivative, an extrapolation of the current consumption can be calculated. For example, consumption has increased for the last six values drawn, so that this increase can be extrapolated further.

Figure 11:
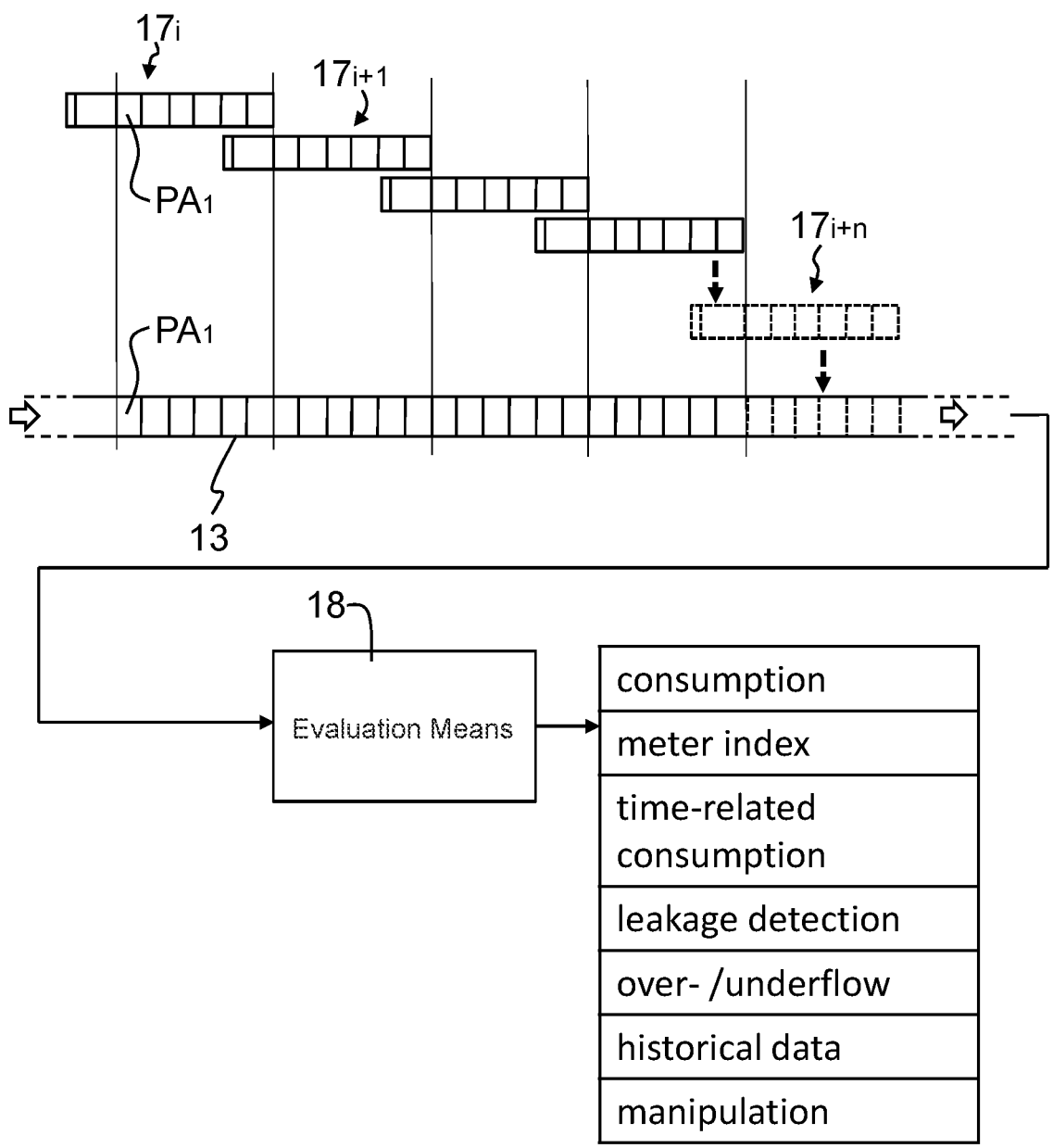
FIG. 11 is an illustration of an example for the combination of the data packets or messages or telegrams or reconstructions containing the time stampings into a continuous stream of raw measurement data including its evaluation options in a highly simplified schematic representation.

FIG. 11 shows the further processing of the individual time stampings TS provided in data telegrams 17$_i$-17$_{i+n}$ to a continuous coherent, assignment from which a gapless raw measurement data stream 13 can be constructed using the correlation model. Here the individual data telegrams 17$_i$-17$_{i+n}$ are combined in such a way that the respective data or data packets PA$_j$ or time stampings TS contained therein are combined in time relation with the adjacent data packets.

By the invention-based collection of raw measurement data supplied by the sensors 1 or consumption meters 10 of the or a specific network, the invention enables all types of evaluation, analysis, verification, monitoring and generally useful or desired processing and utilization, since the basic individual raw information is available. The evaluation of the provided raw measurement data is preferably carried out in the area of the head-end 4 via evaluation means 18 and results in a large amount of important information which is necessary for the management of the supply network but which could not yet be generated, e.g. consumption, meter index, time-related consumption, leakage detection, overflow/underflow, historical data and/or manipulation. This means that information can be retrieved retrospectively and without time gaps at any time and used for a previous evaluation.

In the head-end 4, the reconstructed raw measurement data are available in very high resolution or granularity without time gaps. As a result, in contrast to previous known procedures, there is much more usable data available in the head-end 4 due to the invention-based procedure.

The raw measurement data stream 13 in the head-end 4 preferably has a resolution in the second range, tenth of a second range, hundredth of a second range or thousandth of a second range.

The object of the invention is also, as schematically shown in FIGS. 3A-3F or FIG. 4, a supply network for the distribution of, in particular, fluid consumable goods using appropriately prepared consumption meters 10, which are operated in the supply network. The respective consumption meter 10 contains, see FIG. 5, at least one sensor 1, which can acquire raw measurement data via a measuring element. Furthermore, the respective consumption meter 10 comprises a measurement data processing unit 14, which contains a microprocessor 8, memory means 7 and a time reference device 15. In the measurement data processing unit 14, the raw measurement data is time-stamped, the time-stamped raw measurement data is compressed and prepared in a format that is suitable for transmission via a radio link 11 or via the primary communication path 5 according to a specific protocol.

The consumption meter 10 can include its own power supply (not shown) in the form of a battery or the like if required. This means that the consumption meter 10 can be operated in an energy self-sufficient manner.

In the area of the head-end 4, evaluation means 18 are provided which are able to combine the individual data telegrams 17$_i$-17$_{i+n}$ or their data packets PA$_j$, which are designed as chronograms, continuously in time and without gaps to a continuous uninterrupted raw measurement data stream 13 and to perform corresponding decompressions, evaluations, calculations and the like from there. The corresponding data preferably include all consumption meters 10 in the supply network.

In addition, for the area concerned or for each geographical area in which the consumption meters 10 are installed, the above system comprises a fixed data collector 3 (concentrator) forming a primary communication path 5 of the supply network with the consumption meters 10 of the area allocated to it. The primary communication path 5 can, for example, be designed as radio link 11. The data collector 3 is in turn connected to the head-end 4 via a tertiary communication path 6. The data can be transmitted along the tertiary communication path 6 in different ways, for example via LAN, GPRS, LTE, 3G, etc.

Preferably, the memory means 7 of each sensor 1 or consumption meter 10 form a buffer memory and are suitable and adapted to store the contents of several PA$_j$ packets of time stampings TS, especially in compressed state, the contents or part of the contents of this buffer memory being transmitted at each transmission or retrieval by the data collector 3.

The information collected by each data collector 3 is transmitted directly or indirectly to the head-end 4. The "Business" functions are also defined and executed there.

Figure 12:
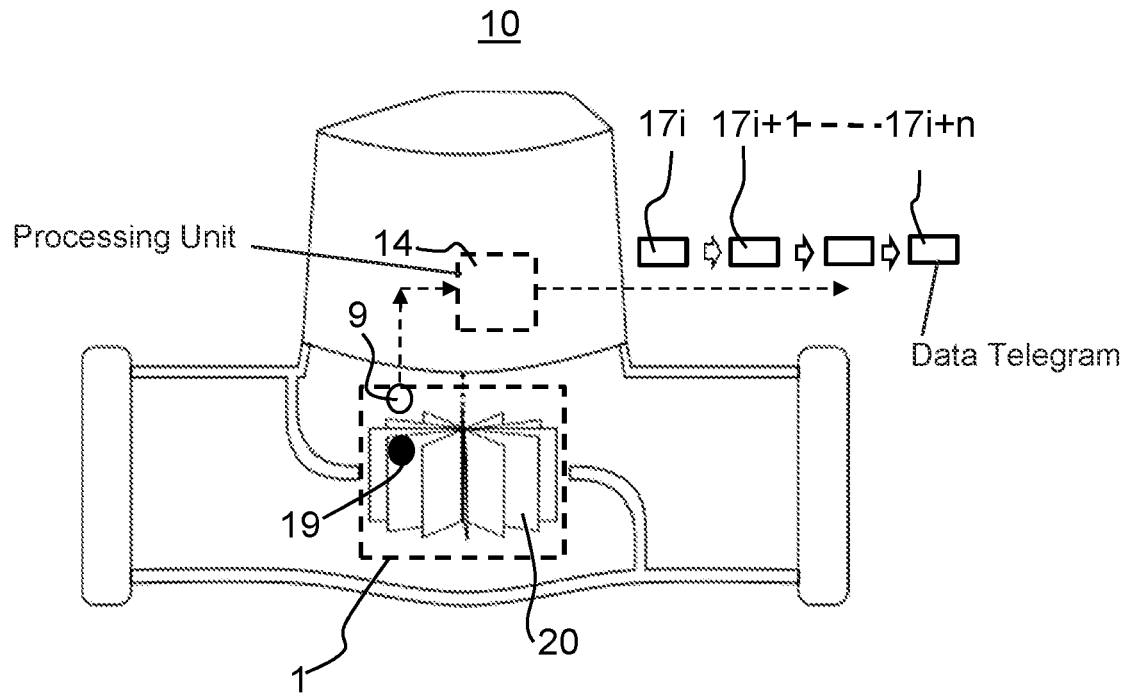
FIG. 12 is an illustration of an example of a sensor of a consumption meter in the form of a mechanical flow meter with an impeller, with which corresponding raw measurement data for the flow rate can be generated.

FIG. 12 shows an example of a mechanical flow meter 10 with a sensor 1 for the flow rate. The sensor 1 contains an impeller 20, a measuring element 9 in the form, for example, of a Hall sensor and a pulse generator element 19, which rotates more of less depending on the flow through the flow meter 10. The rotation of the impeller 20 is detected by the measuring element 9 as a voltage value, which is excited by the pulse generator element 19, when the relevant blade of the impeller 20 is in the position of the measuring element 9. One revolution of the impeller 20 therefore corresponds to a certain flow volume, e.g. one liter of fluid.

Figure 13:
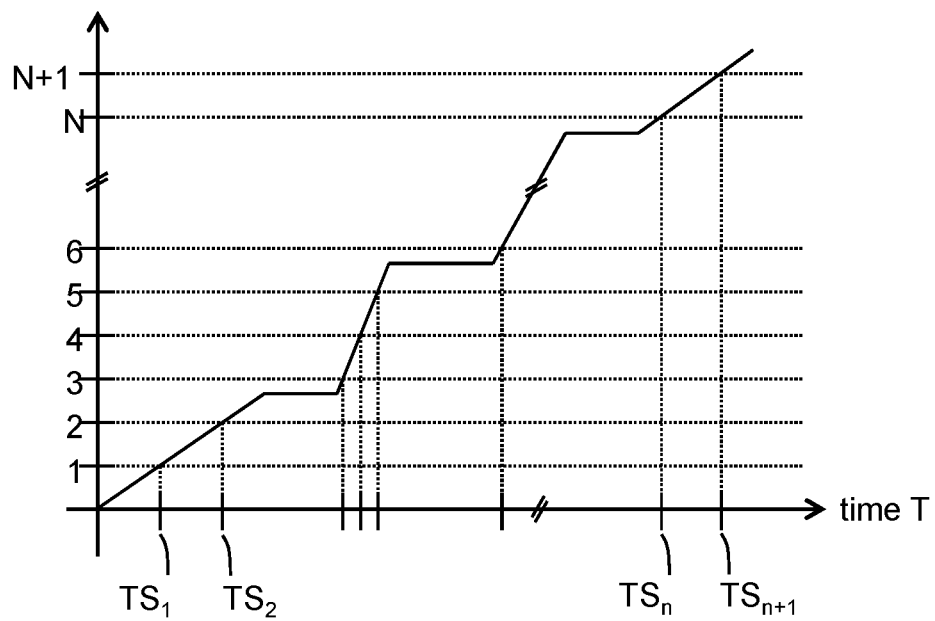
FIG. 13 is a graph showing an example of a correlation model for generating time stampings on the basis of the raw measurement data recorded by the sensor according to FIG. 12.

In the measurement data processing unit 14 a correlation model is stored, with which the conditions for generating time stampings for certain raw measurement values have been defined beforehand. FIG. 13 shows a simplified example of such a correlation model, for example for a continuous cumulative flow measurement. The measurement unit is for example a pulse recorded by the measuring element 9 of the sensor 1 shown in FIG. 12, e.g. a voltage pulse, which corresponds to one rotation of the impeller 20. Therefore the predefined resolution of the measurement method corresponds to one rotation of the impeller 20. The raw measurement values which are the triggered pulses by the rotations and the corresponding times T are stored in the memory means 7 of the sensor 1. The measurement data processing unit 14 generates for every raw measurement value (i.e. for each revolution/impulse) a corresponding time stamping $TS_1$, $TS_2$ bis $TS_{n+1}$. The time stampings TS are continuously stored in the storage media 7. If the impeller 20 is not rotating, no impulse is generated and therefore no time stamping is performed. If the impeller 20 is moving slower, the time of acquisition of the pulse along the time axis T is correspondingly later. Accordingly, in this case a later time stamping TS is generated. As shown in FIG. 13 a plurality of time stampings TS are generated, which define the flow rate measured continuously over the period in question.

The time stampings TS are combined according to FIG. 5 in data packages $PA_j$ and successively transferred as data telegrams $17_i$, $17_{i+1}$, $17_{i+n}$ over the primary communication path 5 to the data collector 3. The data transfer can preferably take place in compressed form. It is therefore a continuous, uninterrupted time stamping stream of data of very high resolution, which is transmitted in the form of the individual continuous data telegrams $17_i$, $17_{i+1}$, . . . , $17_{i+n}$ along the primary communication path 5.

Figure 14:
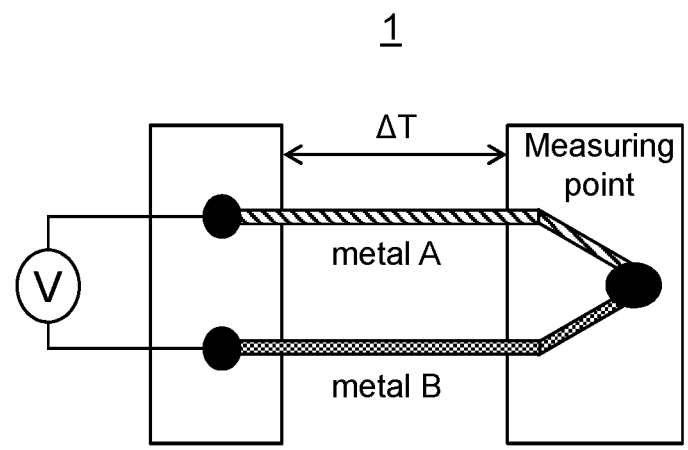
FIG. 14 is an illustration of an example of a temperature sensor in a simple representation.

The collection of data is not limited to a flow measurement. FIG. 14 shows for example a sensor 1 in the form of a temperature sensor based on resistance measurement. The temperature sensor comprises two metal conductors (A, B) with different thermal conductivity connected to each other in the area of a measuring point. In the event of a temperature difference $\Delta T$ between the measuring point and the opposite end of the two conductors, a voltage V or voltage change can be measured. In this case a time stamping TS for a change in the voltage measured by the sensor 1 can be determined as a correlation model.

Figure 15:
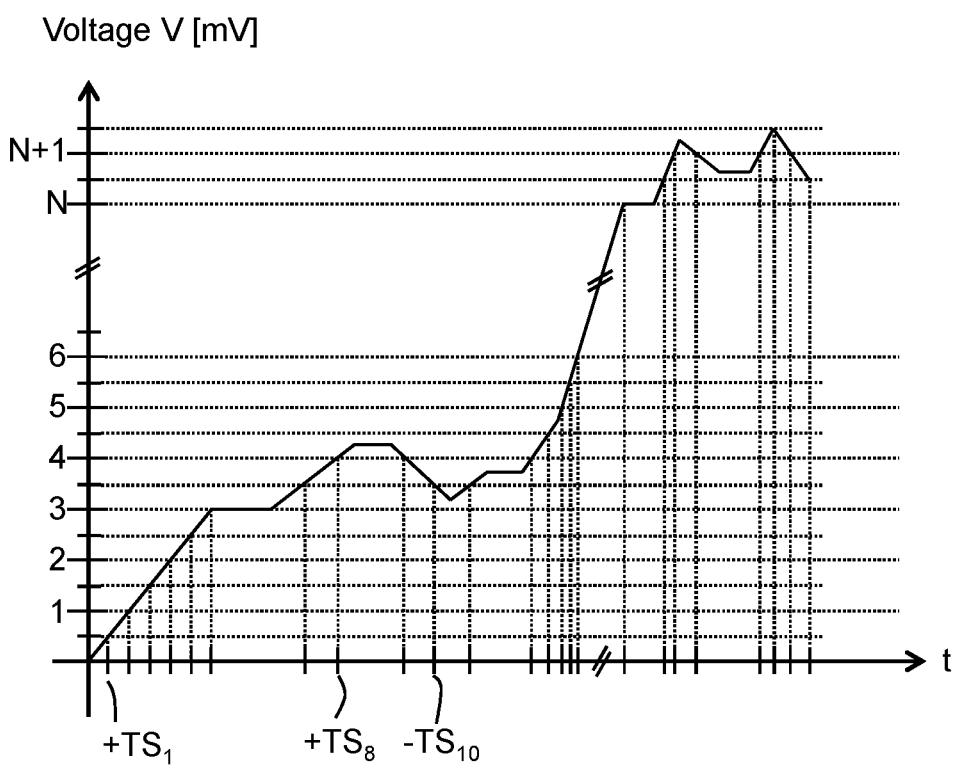
FIG. 15 is a graph showing another example of a correlation model for generating time stampings on the basis of the raw measurement data recorded by the sensor according to FIG. 14.

FIG. 15 show an example of a corresponding raw measurement data curve of voltage values V for generating corresponding time stampings TS at a temperature measurement. Accordingly, each time the voltage rises or falls, e.g. by 0.5 mV, a corresponding time stamping TS is generated. In this case, the determined resolution of the method is therefore 0.5 mV. Since the curve can be ascending or descending for a temperature measurement, the time stampings TS are signed with "+" for ascending or "−" for descending. As can be seen from FIG. 15, a continuous sequence of time stampings TS is also obtained here which represent the measured voltage curve and thus the temperature very accurately and without gaps over the period under consideration. If the temperature i.e. the voltage V does not change, no time stamping TS is generated. Furthermore, the procedure corresponds to the measures described in connection with the example of flow measurement described above.

Figure 16:
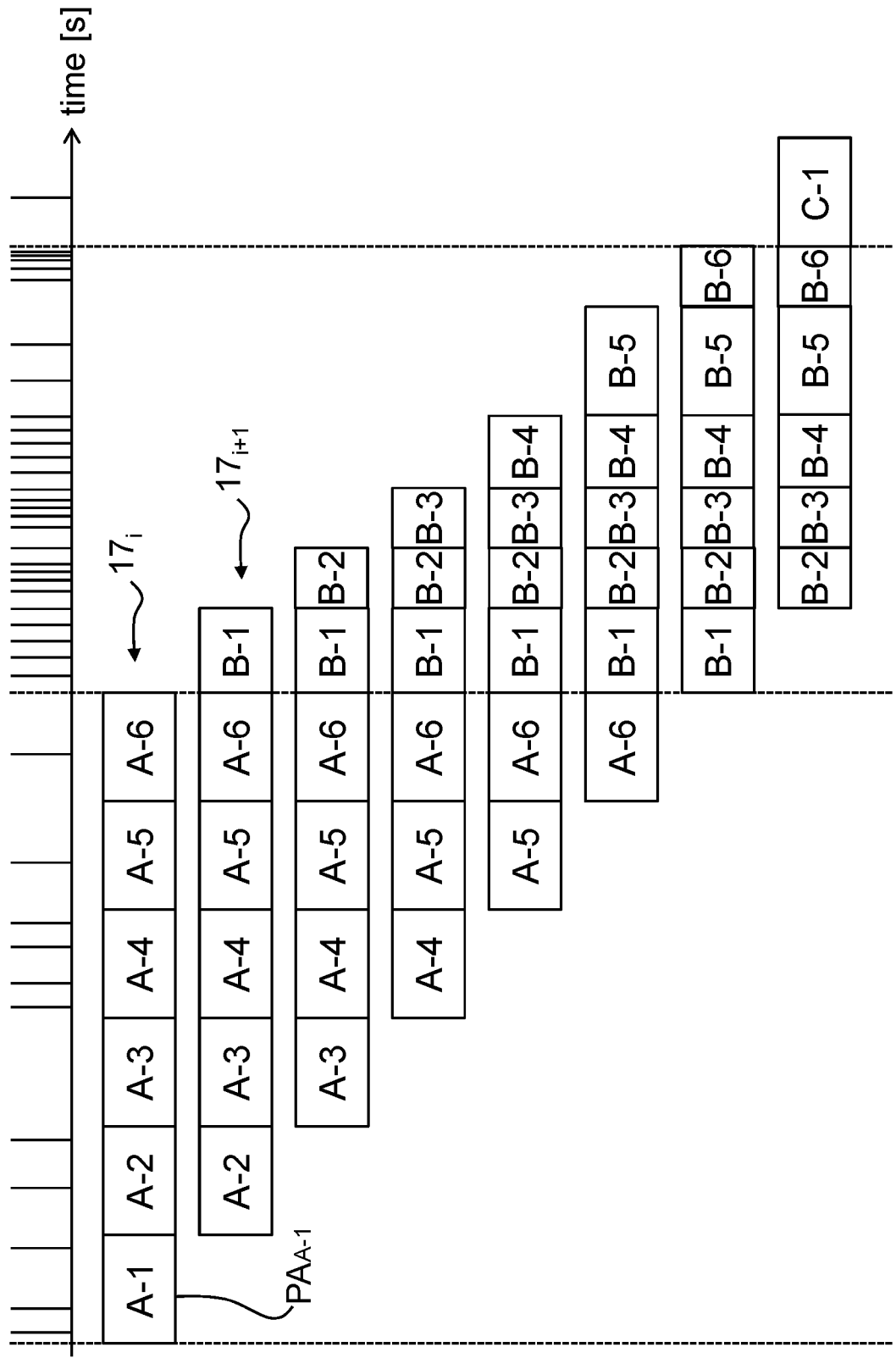
FIG. 16 is an illustration showing an example of a redundant transmission of PA$_j$ data packets.

FIG. 16 shows how redundancy in transmission can be achieved by repeated transmission of the same $PA_j$ data packet through several successive transmission processes. The time stampings TS are drawn on the time scale. The time stampings TS are packed by formatting into data packets PAj of predetermined fixed size. A data packet $PA_j$ is transferred as soon as either a specified time interval has elapsed or the accumulated time stampings TS reach the maximum size of a data packet $PA_j$. In FIG. 16, the maximum size of a data packet $PA_j$ is shown as an example with five time stampings TS. In FIG. 16, the data packets $PA_{A-1}$ to $PA_{A-6}$ as well as $PA_{B-5}$ and $PA_{C-1}$ contain less than five time stampings TS, so that the transmission of these data packets $PA_j$ is triggered by the expiry of the specified time intervals. For the data packets $PA_{B-1}$ to $PA_{B-4}$ and $PA_{B-6}$, the transmission was triggered by reaching the maximum size of the data packet $PA_j$.

Any raw measurement data can thus be sampled using the method according to the invention. The time stampings TS may in particular refer to points in time or time differences. Preferably a start time is defined.

Of course, the invention is not limited to the designs described and depicted in the attached drawings. Changes remain possible, in particular with regard to the procurement of the various elements or by technical equivalents, without thereby leaving the scope of protection of the invention. The object of disclosure expressly includes combinations of sub-characteristics or sub-groups of characteristics among themselves.

The following is a summary list of reference numerals and the corresponding structure used in the above description of the invention:

REFERENCE SIGNS LIST 1 sensor
2 communication means
3/3s/3m data collector/stationary/mobile
4 head end
5 primary communication path
6 tertiary communication path
7 memory means
8 microprocessor
9 measuring element
10 consumption meter
11 radio link
12 remote central processing facility
13 raw measurement data stream
14 measurement data processing unit
15 time reference device
16 supply line
17 data telegram
18 evaluation means
19 pulse generator element
20 impeller
22/23 ultrasonic transducer elements
24 ultrasonic measuring section
30 end point/outflow 31 inflow
32 buffer vessel
33 pressure fluctuation
34 leakage
40 radio tower
50 temporary receiver
60 temporary transceiver
PAj data packet
TS time stamping

The invention claimed is:

1. A method for collecting data relating to a distribution of a consumable good in a network having a consumption meter with at least one local sensor, the at least one local sensor containing at least one measuring element providing raw measurement data corresponding to at least one physical or physicochemical value or at least one physical or physicochemical parameter, the consumption meter further having a memory, the method which comprises the steps of:
   determining in advance, for a determination of a measurement resolution of the at least one local sensor, conditions for generating time stampings using a correlation model, wherein each time stamping corresponds to an elementary quantity of the consumable good;
   generating, on a basis of the correlation model, the time stampings of successive raw measurement data in the at least one local sensor;
   storing the time stampings in the memory of the consumption meter;
   transmitting a number of the time stampings as a data packet without the raw measurement data corresponding to the time stampings of the data packet over a radio link so that on a basis of the time stampings using the correlation model, the raw measurement data collected by the at least one measuring element are reconstructed and evaluated, whereas the raw measurement data are used for on-demand network analysis,
   determining that a specified amount of time stampings has been achieved since a previous transmission; and
   carrying out a new data transmission in a form of a message or a telegram in response to determining that the specified amount of time stampings has been achieved since the previous transmission.

2. The method according to claim 1, which further comprises transmitting the time stampings over the radio link via a primary communication path to a temporary receiver.

3. The method according to claim 2, which further comprises storing the time stampings in the temporary receiver.

4. The method according to claim 2, which further comprises using temporary receivers for gathering the time stampings in a defined coverage area.

5. The method according to claim 2, wherein a use of the temporary receiver for gathering the time stampings is limited to a certain period of time.

6. The method according to claim 2, which further comprises forwarding, via the temporary receiver, the time stampings received via a tertiary communication path to a remote central processing facility.

7. The method according to claim 2, which further comprises reading out the temporary receiver in a remote central processing facility.

8. The method according to claim 2, wherein a network monitoring and evaluation of the measurement data take place in a remote central processing facility.

9. The method according to claim 2, which further comprises carrying out data transmission with redundancy.

10. The method according to claim 9, wherein the redundancy in the data transmission is achieved by repeated transmission of a same data packet in several successive transmission processes.

11. The method according to claim 9, wherein the redundancy in the data transmission is achieved by repeated transmission of a same time stamping.

12. The method according to claim 1, which further comprises transferring the time stampings in compressed form.

13. The method according to claim 12, which further comprises performing compression of the time stampings without loss.

14. A sensor, comprising:
   at least one measuring element providing raw measurement data corresponding to at least one physical or physicochemical value or at least one physical or physicochemical parameter;
   a memory; and
   the sensor being programmed to perform the method according to claim 1, wherein the sensor is the at least one local sensor.

15. The method according to claim 1, wherein within a framework of the correlation model a certain value, a certain change in value or a certain difference in value of the at least one physical or physicochemical value or the at least one physical or physicochemical parameter is determined for an assignment of a time stamping, and on recording the certain value, the certain change in value or the certain difference in value by the at least one measuring element a time stamping is triggered and stored in the memory of the consumption meter.

16. The method according to claim 1, wherein within a framework of the correlation model a stepwise or incremental increasing meter reading and/or a table of values is represented by the time stampings.

17. The method according to claim 1, wherein the time stampings have a sign.

18. The method according to claim 1, wherein for reconstructing and evaluating the raw measurement data collected by the at least one measuring element a basic index of the at least one local sensor and the time stampings indicating an incremental increase and/or decrease of an index are transmitted.

19. The method according to claim 1, wherein after receiving data packets or data telegrams, the data packets or the data telegrams are reassembled in an appropriate time sequence reference.

20. The method according to claim 1, wherein on a basis of the time stampings using the correlation model a raw measurement data stream is generated.

21. The method according to claim 1, which further comprises providing a plurality of sensors and/or consumption meters and/or stationary and/or mobile data collectors as nodes of the network.

22. The method according to claim 21, wherein if a permanent radio link to the at least one local sensor and/or the consumption meter is not available, nodes of the network are used as temporary transceivers.

23. The method according to claim 21, wherein the nodes of the network are used as temporary transceivers for the on-demand network analysis.

24. The method according to claim 1, which further comprises using temporary transceivers for mobile reading scenarios.

25. The method according to claim 1, which further comprises forming the network as a mesh network.

26. The method according to claim 1, wherein information transfer within the network is realized by a cascade of temporary transceivers.

27. The method according to claim 1, which further comprises performing the on-demand network analysis during live operation.

28. The method according to claim 27, wherein the on-demand network analysis includes load-dependent network restructuring.

29. The method according to claim 1, which further comprises determining a consumption signature for the at least one local sensor being one of a plurality of sensors.

30. The method according to claim 29, which further comprises using the consumption signature to identify a potential metering failure.

31. The method according to claim 1, wherein the network forms a closed consumption network with inputs and outputs, whereas unidentified outputs from the network are being used for fault diagnosis.

32. The method according to claim 1, which further comprises:
connecting the at least one local sensor to a data collector via a primary communication path;
providing a tertiary communication path between the data collector and a head end;
transmitting the time stampings by the at least one local sensor; and
collecting, storing and/or evaluating the time stampings in the data collector and/or in the head end.

33. The method according to claim 1, wherein a configuration of the at least one local sensor and/or a line section is determined on a basis of current consumption in the network.

34. The method according to claim 1, wherein a sensor consumption profile analysis is performed for diagnosis of the network.

35. The method according to claim 1, which further comprises taking a snapshot of the network at time $T_0$ to determine a current meter reading of the at least one local sensor being one of a plurality of sensors being read.

36. The method according to claim 35, which further comprises taking a snapshot of the network at time T1 to determine the consumption in a time interval from the time $T_0$ to the time T1.

37. The method according to claim 35, which further comprises forming a time derivative of a current consumption value to extrapolate consumption.

38. The method according to claim 1, which further comprises evaluating a raw measurement data stream without time gaps in a data processing sequence.

39. The method according to claim 1, wherein an elementary measuring unit refers to an electric voltage or to an electric current.

40. The method according to claim 1, wherein measured physical quantity refers to a flow of a medium flowing through a supply line of the network.

41. The method according to claim 1, wherein measured physical or chemical-physical parameter(s) is/are characteristic of a quantity, a quality and/or composition of a fluid flowing through or contacted by the at least one local sensor.

42. The method according to claim 1, wherein the at least one measuring element generates the time stamping, when the at least one measuring element receives a pulse.

43. The method according to claim 1, which further comprises executing a new data transmission in a form of a message or a telegram as soon as at least one of two conditions is met:

(a) expiration of a specified time interval; and
(b) achieving a specified amount of the time stampings since a previous transmission.

44. The method according to claim 1, which further comprises packaging the time stampings by formatting the time stampings into data packets of predetermined fixed size, wherein each time accumulated data reaches a size of a data packet or a predetermined time interval has expired, a new transmission is triggered.

45. A consumption meter, comprising:
a sensor containing at least one measuring element providing raw measurement data corresponding to at least one physical or physicochemical value or at least one physical or physicochemical parameter;
a memory;
the consumption meter collecting the raw measurement data relating to a distribution of a consumable good in a network having the consumption meter, said consumption meter programmed to:
determine in advance, for a determination of a measurement resolution of said sensor, conditions for generating time stampings using a correlation model, wherein each time stamping corresponds to an elementary quantity of the consumable good;
generate, on a basis of the correlation model, the time stampings of successive raw measurement data in said sensor;
store the time stampings in said memory;
transmit a number of the time stampings as a data packet without the raw measurement data corresponding to the time stampings of the data packet over a radio link so that on a basis of the time stampings using the correlation model, the raw measurement data collected by the at least one measuring element are reconstructed and evaluated, whereas the raw measurement data are used for on-demand network analysis;
determine that a specified amount of time stampings has been achieved since a previous transmission; and
carry out a new data transmission in a form of a message or a telegram in response to determining that the specified amount of time stampings has been achieved since the previous transmission.

46. A network, comprising:
a consumption meter, containing:
a sensor containing at least one measuring element providing raw measurement data corresponding to at least one physical or physicochemical value or at least one physical or physicochemical parameter;
a memory;
said consumption meter collecting data relating to a distribution of a consumable good in the network, said consumption meter programmed to:
determine in advance, for a determination of a measurement resolution of said sensor, conditions for generating time stampings using a correlation model, wherein each time stamping corresponds to an elementary quantity of the consumable good;
generate, on a basis of the correlation model, the time stampings of successive raw measurement data in said sensor;
store the time stampings in said memory;
transmit a number of the time stampings as a data packet without the raw measurement data corresponding to the time stampings of the data packet over a radio link so that on a basis of the time stampings using the correlation model, the raw measurement data collected by the at least one measuring element are reconstructed and evaluated, whereas the raw measurement data are used for on-demand network analysis;

determine that a specified amount of time stampings has been achieved since a previous transmission; and carry out a new data transmission in a form of a message or a telegram in response to determining that the specified amount of time stampings has been achieved since the previous transmission.

\* \* \* \* \*